US012675187B2

(12) United States Patent (10) Patent No.: US 12,675,187 B2

Kim et al. (45) Date of Patent: Jul. 7, 2026

(54) TOUCH DETECTION DEVICE, DISPLAY DEVICE INCLUDING THE SAME, AND METHOD OF DRIVING THE SAME

(71) Applicants: SAMSUNG DISPLAY CO., LTD., Yongin-si (KR); Research & Business Foundation SUNGKYUNKWAN UNIVERSITY, Suwon-si (KR)

(72) Inventors: Ji Woong Kim, Yongin-si (KR); Kang Yoon Lee, Seoul (KR); Oh Jo Kwon, Yongin-si (KR); Dong Gyu Kim, Suwon-si (KR); Chang Hyeon Kim, Suwon-si (KR)

(73) Assignees: SAMSUNG DISPLAY CO., LTD., Yongin-si (KR); RESEARCH AND BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 18/469,714

(22) Filed: Sep. 19, 2023

(65) Prior Publication Data

US 2024/0241598 A1     Jul. 18, 2024

(30) Foreign Application Priority Data

Jan. 16, 2023    (KR) ........................ 10-2023-0005935

(51) Int. Cl.
 *G06F 3/041* (2006.01)
 *G06F 3/044* (2006.01)
 *H03K 17/96* (2006.01)
(52) U.S. Cl.
 CPC .......... *G06F 3/04166* (2019.05); *G06F 3/044* (2013.01); *H03K 17/962* (2013.01)

(58) Field of Classification Search
 CPC .... G06F 3/041; G06F 3/0416; G06F 3/04166; G06F 3/044
 See application file for complete search history.

(56) References Cited

U.S. PATENT DOCUMENTS

| | | | |
|---|---|---|---|
| 10,120,498 B2 | 11/2018 | Gray | |
| 10,917,101 B2 | 2/2021 | Mcgibney et al. | |
| 2018/0181258 A1* | 6/2018 | Lu | G06F 3/04166 |
| 2021/0200349 A1* | 7/2021 | Mohamed | G06F 3/0446 |
| 2022/0187944 A1* | 6/2022 | Mohamed | G06F 3/0418 |

FOREIGN PATENT DOCUMENTS

| | | |
|---|---|---|
| JP | 2013143152 | 7/2013 |
| JP | 6660066 | 2/2020 |
| KR | 10-2021-0017598 | 2/2021 |

* cited by examiner

*Primary Examiner* — Dennis P Joseph

(74) *Attorney, Agent, or Firm* — F. CHAU & ASSOCIATES, LLC

(57) ABSTRACT

A touch detection device supplies driving signals generated based on orthogonal carriers and a CDMA scheme to driving electrodes. A touch driving circuit drives the driving electrodes in groups including a first group and a second group, supplies first driving signals based on a designated first frequency and first orthogonal codes set to correspond to the driving electrodes of the first group, respectively, to the driving electrodes of the first group, and supplies second multiple driving signals based on a second frequency orthogonal to the first frequency and second orthogonal codes set to correspond to the driving electrodes of the second group, respectively, to the driving electrodes of the second group.

7 Claims, 18 Drawing Sheets

DU: SUB, TFTL, EML, TFEL

TXC : TX1, TX2, TX3,TX4, TX5, TX6, TX7, TX8

FIG. 18

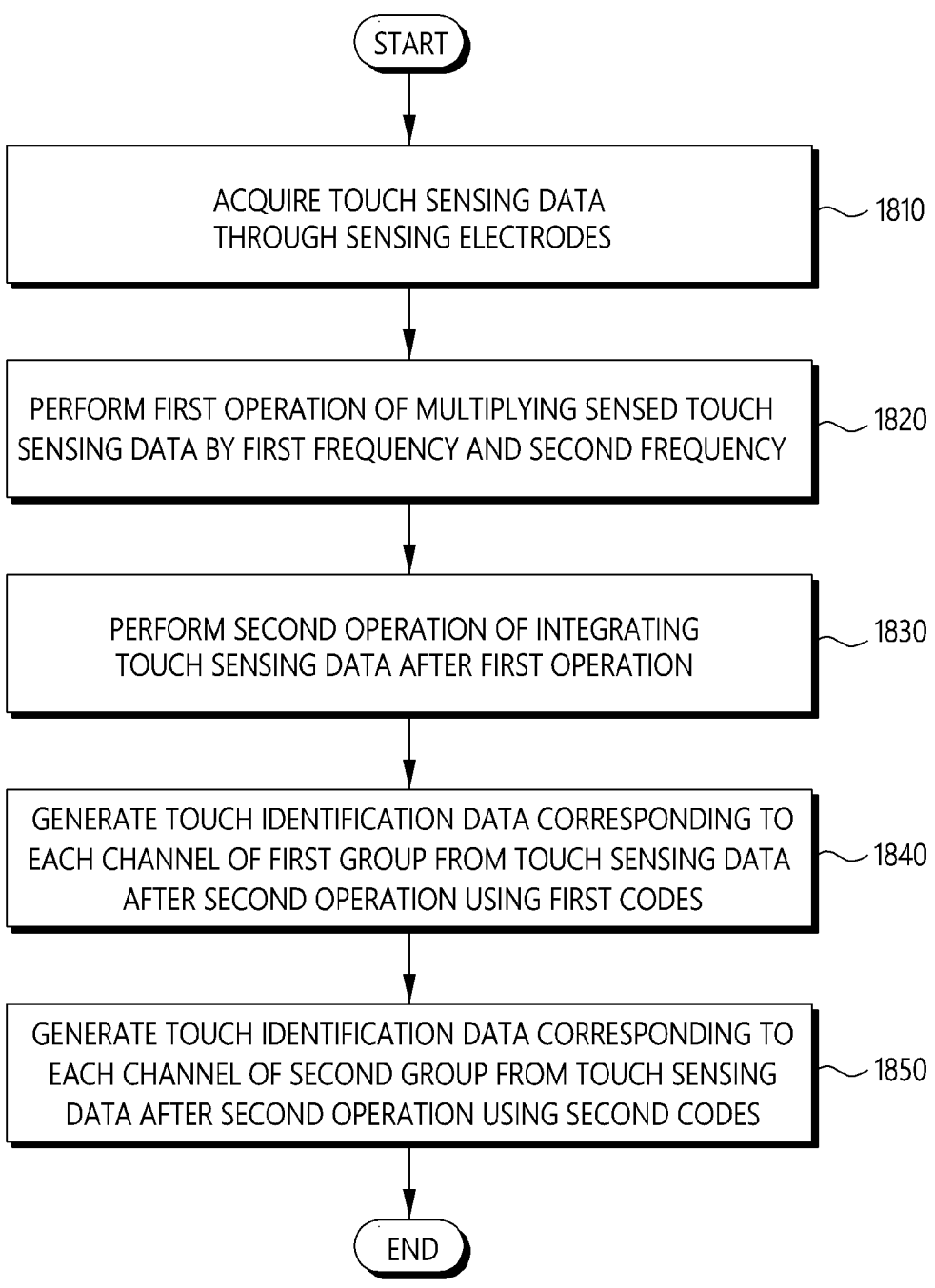

START

ACQUIRE TOUCH SENSING DATA
THROUGH SENSING ELECTRODES ⟿ 1810

PERFORM FIRST OPERATION OF MULTIPLYING SENSED TOUCH
SENSING DATA BY FIRST FREQUENCY AND SECOND FREQUENCY ⟿ 1820

PERFORM SECOND OPERATION OF INTEGRATING
TOUCH SENSING DATA AFTER FIRST OPERATION ⟿ 1830

GENERATE TOUCH IDENTIFICATION DATA CORRESPONDING TO
EACH CHANNEL OF FIRST GROUP FROM TOUCH SENSING DATA
AFTER SECOND OPERATION USING FIRST CODES ⟿ 1840

GENERATE TOUCH IDENTIFICATION DATA CORRESPONDING TO
EACH CHANNEL OF SECOND GROUP FROM TOUCH SENSING
DATA AFTER SECOND OPERATION USING SECOND CODES ⟿ 1850

END

TOUCH DETECTION DEVICE, DISPLAY DEVICE INCLUDING THE SAME, AND METHOD OF DRIVING THE SAME

CROSS REFERENCE TO RELATED APPLICATION

This application claims priority to Korean Patent Application No. 10-2023-0005935 filed on Jan. 16, 2023 in the Korean Intellectual Property Office, and all the benefits accruing therefrom under 35 U.S.C. 119, the content of which is incorporated by reference herein in its entirety.

FIELD OF THE DISCLOSURE

The present disclosure relates to a touch detection device, a display device including the same, and a method for driving the same.

DESCRIPTION OF THE RELATED ART

Display devices may be flat panel display devices such as a liquid-crystal display device, a field emission display device, and an organic light-emitting display (LED) device. Among such flat panel display devices, an LED device includes a light-emitting element that can emit light on its own, so that each of the pixels of the display panel can emit light by themselves. Accordingly, an LED device can display images without a backlight unit that supplies light to the display panel.

A display device may include a touch detection device that recognizes a touch input as an input device. The touch detection device may detect a user's touch input by capacitive sensing and calculate the position where the touch input is detected (e.g., touch input coordinates). To this end, efforts continue to improve the response speed of touch detection and reduce the occurrence of false detections.

SUMMARY

Aspects of the present disclosure provide a touch detection device that can detect a touch and can increase response speed without an excessive number of frequency filters (e.g., narrow bandpass digital filters) by way of driving touch electrodes based on an orthogonal frequency division multiplexing (OFDM) scheme and a code division multiple access (CDMA) scheme, a display device including the same, and a method of driving the same.

According to an embodiment of the present disclosure, a touch detection device may include touch electrodes including a plurality of driving electrodes and a plurality of sensing electrodes intersecting the plurality of driving electrodes to form a plurality of touch nodes, a touch driving circuit electrically connected to the plurality of driving electrodes and configured to supply driving signals generated based on an OFDM scheme and a CDMA scheme to the plurality of driving electrodes, and a touch sensing circuit electrically connected to the plurality of sensing electrodes and configured to sense a change in capacitance of each of the plurality of touch nodes through the plurality of sensing electrodes while the driving signals are supplied to the plurality of driving electrodes. The touch driving circuit drives the driving electrodes in groups including a first group and a second group, supplies first driving signals based on a designated first frequency and first orthogonal codes set to correspond to the driving electrodes of the first group, respectively, to the driving electrodes of the first group, and supplies second driving signals based on a second frequency orthogonal to the first frequency and second orthogonal codes set to correspond to the driving electrodes of the second group, respectively, to the driving electrodes of the second group.

In various embodiments:

The touch sensing circuit may acquire touch sensing data items through the sensing electrodes, perform a first operation of multiplying the touch sensing data items by the first frequency and the second frequency, perform a second operation of integrating the touch sensing data item after the first operation has been performed, and generates touch identification data corresponding to a change in capacitance of each of the touch nodes from the touch sensing data items after the second operation has been performed using the first orthogonal codes and the second orthogonal codes.

The touch driving circuit may include a frequency generator configured to generate a first sine wave based on the first frequency and a second sine wave based on the second frequency, and a driving signal modulator configured to generate the first driving signals by multiplying the first sine wave by the first orthogonal codes and generate the second driving signals by multiplying the second sine wave by the second orthogonal codes.

The driving electrodes of the first group may include n driving electrodes. The driving electrodes of the second group may include m driving electrodes, wherein n is equal to m.

The first orthogonal codes may include first to nth codes associated with the n driving electrodes, respectively. The first to nth codes may include data based on Walsh codes orthogonal to one another.

The second orthogonal codes may be the same as the first orthogonal codes and may include the first to mth codes associated with the m driving electrodes, respectively.

The touch sensing circuit may include an amplifier configured to amplify first touch sensing data items sensed through the plurality of sensing electrodes, an analog-to-digital converter configured to generate second touch sensing data items by converting the amplified first touch sensing data items into digital data, an OFDM demodulator configured to perform the first operation and the second operation on the second touch sensing data items, and a CDMA demodulator configured to generate touch identification data from the second touch sensing data items after the second operation has been performed using the first orthogonal codes and the second orthogonal codes.

According to an embodiment of the present disclosure, a display device may include a display panel, and a touch detection device. The touch detection device may include touch electrodes including a plurality of driving electrodes and a plurality of sensing electrodes intersecting the plurality of driving electrodes to form a plurality of touch nodes, a touch driving circuit electrically connected to the plurality of driving electrodes and configured to supply multiple driving signals generated based on an OFDM scheme and a CDMA scheme to the plurality of driving electrodes, and a touch sensing circuit electrically connected to the plurality of sensing electrodes and configured to sense a change in capacitance of each of the plurality of touch nodes through the plurality of sensing electrodes while the multiple driving signals are supplied to the plurality of driving electrodes. The touch driving circuit drives the driving electrodes bin groups including a first group and a second group, supplies first multiple driving signals based on a designated first frequency and first orthogonal codes set to correspond to the driving electrodes of the first group, respectively, to the driving electrodes of the first group, and supplies a second multi-drive signal based on a second frequency orthogonal to the first frequency and second orthogonal codes set to correspond to each of the second group of drive electrodes to the second group of drive electrodes.

According to an embodiment of the present disclosure, a method of driving a display device including a display panel and a touch detection device may include supplying, by a touch driving circuit, driving signals generated based on an OFDM scheme and a CDMA scheme to a plurality of driving electrodes, and sensing a change in capacitance of each of a plurality of touch nodes through a plurality of sensing electrodes while the driving signals are supplied to the plurality of driving electrodes. Supplying the driving signals may include driving the driving electrodes in groups including a first group and a second group, supplying first driving signals based on a designated first frequency and first orthogonal codes set to correspond to the driving electrodes of the first group, respectively, to the driving electrodes of the first group, and supplying second multiple driving signals based on a second frequency orthogonal to the first frequency and second orthogonal codes set to correspond to the driving electrodes of the second group, respectively, to the driving electrodes of the second group.

According to another embodiment, a touch detection device similar to that summarized above includes a touch driving circuit electrically connected to the plurality of driving electrodes and configured to supply driving signals generated based on orthogonal carriers and a code division multiple access (CDMA) scheme to the plurality of driving electrodes. A touch sensing circuit is electrically connected to the plurality of sensing electrodes and configured to sense a change in capacitance of each of the plurality of touch nodes through the plurality of sensing electrodes while the driving signals are supplied to the plurality of driving electrodes. The touch driving circuit drives the driving electrodes in groups including at least a first group and a second group, supplies first driving signals based on a designated first frequency and first orthogonal codes set to correspond to the driving electrodes of the first group, respectively, to the driving electrodes of the first group, and supplies second driving signals based on a second frequency orthogonal to the first frequency and second orthogonal codes set to correspond to the driving electrodes of the second group, respectively, to the driving electrodes of the second group.

According to exemplary embodiments of the present disclosure, it is possible to form a touch sensing circuit without using an excessive number of frequency filters (e.g., narrow bandpass digital filters) by way of generating touch driving signals according to the CDMA scheme, and to reduce the number of elements and the fabrication cost.

In addition, by generating touch driving signals according to the OFDM scheme, it is possible to reduce the data processing time due to the code length of the CDMA scheme and to increase the touch response speed.

BRIEF DESCRIPTION OF THE DRAWINGS

The above and other aspects and features of the present disclosure will become more apparent by describing in detail exemplary embodiments thereof with reference to the attached drawings, in which:

FIG. 18 is a flowchart for illustrating the operations of a touch sensing circuit according to an exemplary embodiment.

DETAILED DESCRIPTION OF EMBODIMENTS

Embodiments of the present inventive concept will now be described more fully hereinafter with reference to the accompanying drawings. The inventive concept, however, may be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings herein.

Herein, when referring to tonal signals, the terms "sine wave", "sinusoid", "frequency" and "carrier" may be used interchangeably.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
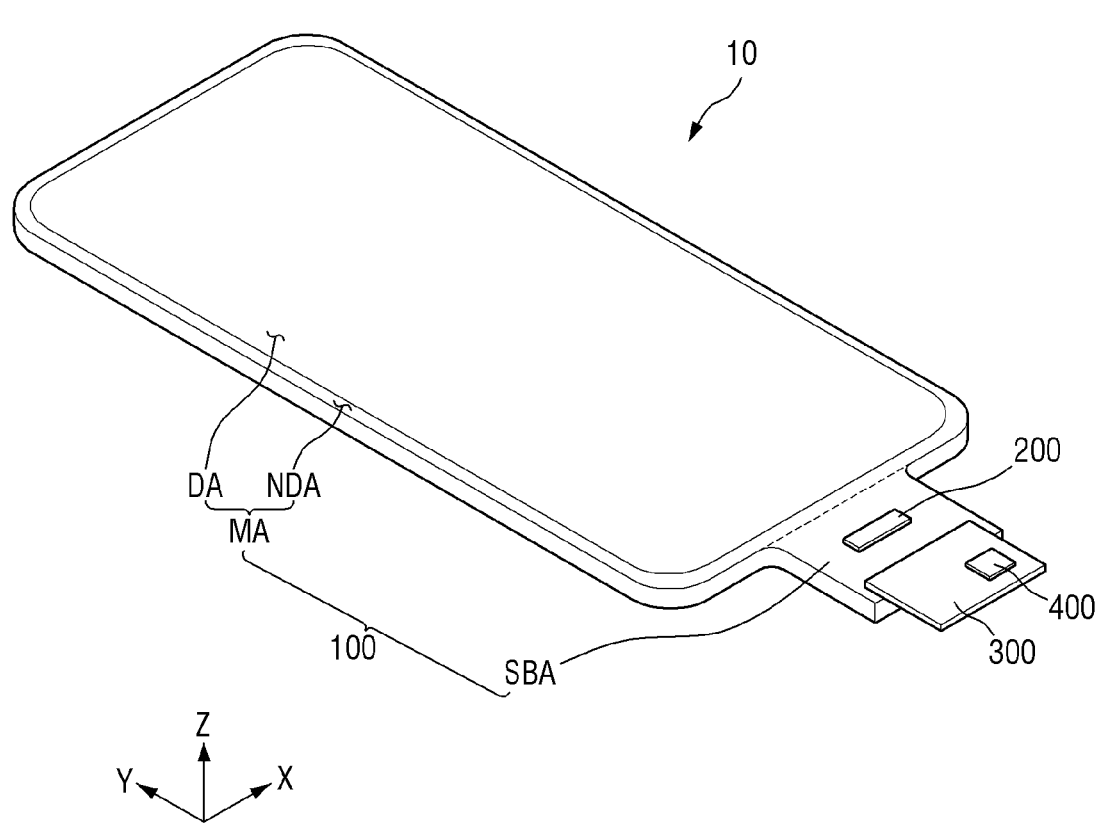
FIG. 1 is a plan view of a display device according to an exemplary embodiment of the present disclosure.
Figure 2:
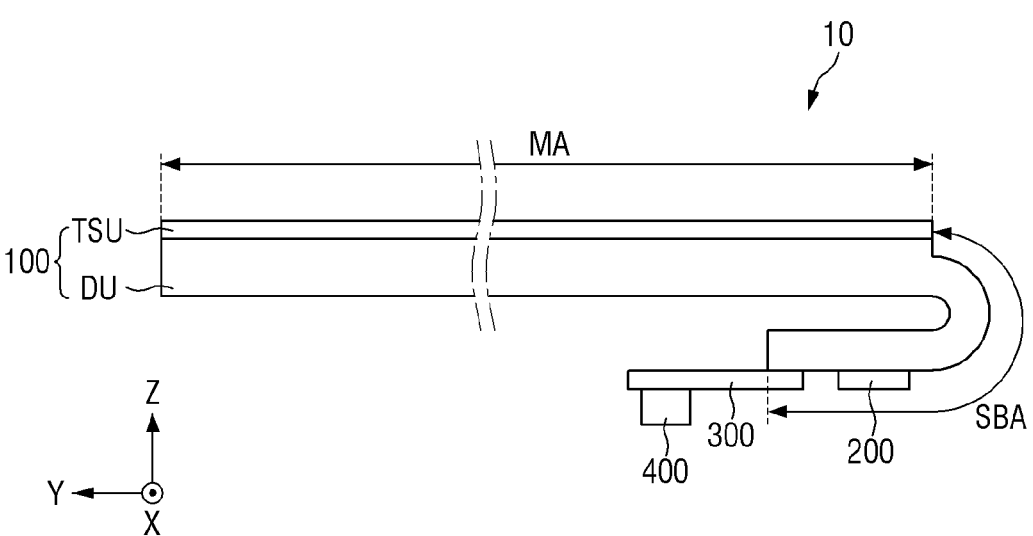
FIG. 2 is a cross-sectional view of a display device according to an exemplary embodiment of the present disclosure.

FIG. 1 is a plan view of a display device according to an exemplary embodiment of the present disclosure. FIG. 2 is a cross-sectional view of a display device according to an exemplary embodiment of the present disclosure.

In the drawings, a first direction X refers to a direction parallel to a side of the display device 10 when viewed from the top, i.e., the shorter side direction of the display device 10. A second direction Y refers to a direction parallel to another side of the display device 10 that meets the side when viewed from the top, i.e., the longer side direction of the display device 10. A third direction Z refers to the thickness direction of the display device 10. It should be understood that the directions referred to in the exemplary embodiments are relative directions, and the exemplary embodiments are not limited to the directions mentioned.

The display device 10 may include a variety of electronic devices that provide a display screen. For example, the display device 10 may be employed by portable electronic devices such as a mobile phone, a smart phone, a tablet PC, a mobile communications terminal, an electronic notebook, an electronic book, a portable multimedia player (PMP), a navigation device and an ultra mobile PC (UMPC). For example, the display device 10 may be used as a display unit DU of a television, a laptop computer, a monitor, an electronic billboard, or the internet of Things (IOT). In addition, the display device 10 may be applied to wearable devices such as a smart watch, a watch phone, a glasses-type display, and a head-mounted display (HMD) device.

Referring to FIG. 1, the display device 10 may have a shape similar to a rectangle when viewed from the top. For example, the display device 10 may have a shape similar to a quadrangle having shorter sides in the first direction X and longer sides in the second direction Y when viewed from the top. The corners where the shorter sides in the first direction X meet the longer sides in the second direction Y may be rounded with a predetermined curvature or may be a right angle. The shape of the display device 10 when viewed from the top is not limited to a rectangular shape, but may have a shape similar to other polygonal shapes, a circular shape, or an elliptical shape.

At least one of the front surface and the rear surface of the display device 10 may be a display surface. As used herein, the front surface refers to the surface located on one side of a plane, i.e., the surface located on the side indicated by the arrow of the third direction Z in the drawings. The rear surface refers to the surface located on the opposite side of the plane, i.e., the surface located on the opposite side to the side indicated by the arrow of the third direction Z in the drawings. The display device 10 may be a double-sided display device 10 in which images can be displayed on both the front and rear surfaces. In the following description, the display surface is located on the front side of the display device 10 according to the exemplary embodiment.

The display device 10 includes a display panel 100 providing a display screen, a display driver 200, a circuit board 300 and a touch driver 400. The touch driver 400 is an element configured to sense a user's touch input and may be referred to as a "touch detection device."

The display panel 100 may have a shape similarly to a rectangular shape when viewed from the top. For example, the display panel 100 may have a shape similar to a quadrangle having shorter sides in the first direction X and longer sides in the second direction Y when viewed from the top. The corners where the shorter sides in the first direction X meet the longer sides in the second direction Y may be rounded with a predetermined curvature or may be a right angle. The shape of the display panel 100 when viewed from the top is not limited to a rectangular shape, but may have a shape similar to other polygonal shapes, a circular shape, or an elliptical shape. In addition, the display panel 100 may be formed to be flexible so that it can be curved or bent.

The display panel 100 may include a main area MA and a subsidiary area SBA.

The main area MA may include the display area DA including pixels for displaying images, and the non-display area NDA located around the display area DA. The display area DA may emit light from a plurality of emission areas or a plurality of opening areas. For example, the display panel 100 may include a pixel circuit including switching elements, a pixel-defining layer that defines the emission areas or the opening areas, and a self-light-emitting element.

The non-display area NDA may be disposed on the outer side of the display area DA. The non-display area NDA may be defined as the edge area of the main area MA of the display panel 100. The non-display area NDA may include a gate driver (not shown) supplying gate signals to gate lines (not shown) of the display panel 100.

The subsidiary area SBA may be extended from one side of the main area MA. The subsidiary area SBA may be bent such that it overlaps with the main area MA in the third direction Z. The subsidiary area SBA may include pads connected to the display driver 200 and the circuit board 300.

Referring to FIG. 2, the display panel 100 may include a display unit DU and a touch unit TSU.

Figure 3:
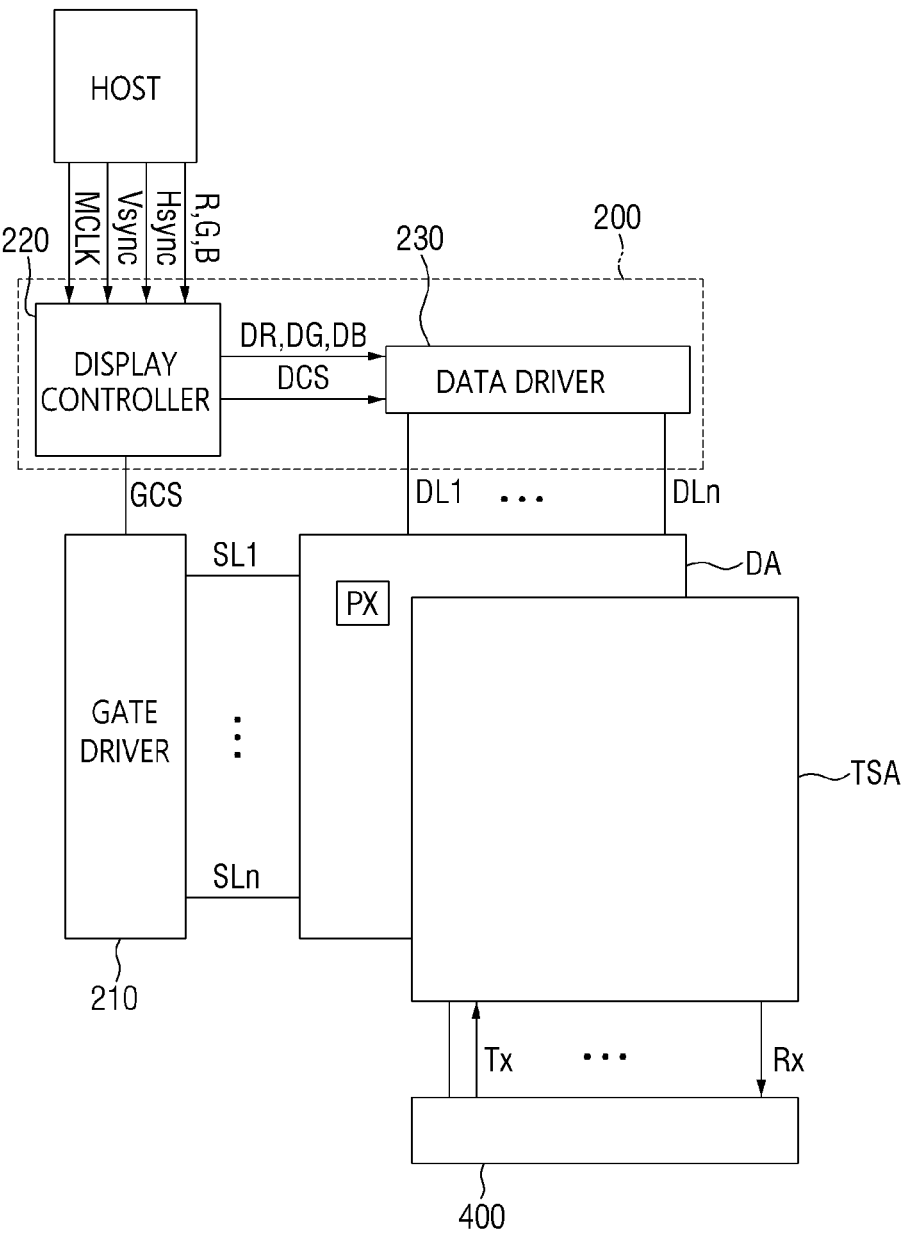
FIG. 3 is a view conceptually showing the display unit and the touch driver according to the exemplary embodiment of the present disclosure.

The display unit DU may include a plurality of pixels PX (see FIG. 3). Each of the pixels PX is a unit for displaying an image. One pixel PX may include, but is not limited to, a red sub-pixel, a green sub-pixel and a blue sub-pixel. The plurality of pixels PX may be arranged alternately when viewed from the top. For example, the pixels PX may be arranged in, but is not limited to, a matrix.

The touch unit TSU may be disposed on the display unit DU. The touch unit TSU may include a plurality of touch electrodes RE and TE (see FIG. 5) for detecting a user's touch by capacitive sensing, a plurality of touch driving lines TL (see FIG. 5) for connecting the plurality of touch electrodes TE with the touch driver 4000, and a plurality of touch sensing lines RL (see FIG. 5). The touch unit TSU is a layer that detects a touch input and may work as a touch member. The touch unit TSU may determine whether there is a touch input and may calculate touch input coordinates of the position, if any. The display unit DU and the touch unit TSU will be described in detail later with reference to FIGS. 4 to 7.

The display unit DU and the touch unit TSU may overlap each other. For example, the display area DA may display images on the screen and may detect a touch input.

The subsidiary area SBA of the display panel 100 may be extended from one side of the main area MA. The subsidiary area SUB may include a flexible material that can be bent, folded, or rolled. For example, a part of the subsidiary area SBA may be bent on one side of the main area MA, and another part of the subsidiary area SBA extended from the bent part of the subsidiary area SBA may overlap with the main area MA in the third direction (z-axis direction). The subsidiary area SBA may include pads connected to the display driver 200 and the circuit board 300.

Referring to FIG. 1, the display driver 200 may be disposed in the subsidiary area SBA of the display panel 100. In addition, the display driver 200 may be implemented as an integrated circuit (IC) and may be mounted on the display panel 100 by the chip-on-glass (COG) technique, or the chip-on-plastic (COP) technique.

The display driver 200 may output data signals and voltages for driving the display panel 100. The display driver 200 may supply data voltages to data lines (not shown) of the display panel 100. The display driver 200 may provide supply voltages to voltage lines of the display panel 100 and may provide gate control signals to the gate driver.

The circuit board 300 may be disposed in the subsidiary area SBA of the display panel 100. Lead lines (not shown) of the circuit board 300 may be electrically connected to the pads of the display panel 100. The circuit board 300 may be a flexible printed circuit board, a printed circuit board, or a flexible film such as a chip-on film.

The circuit board 300 may include a plurality of conductive layers (not shown) that transmits a signal from a main circuit board (not shown) to the display driver 200 or electrically connects the touch driver 400 with the plurality of touch electrodes TE and the sensing electrodes RE of the touch unit TSU.

The touch driver 400 may be disposed in the subsidiary area SBA of the display panel 100. Alternatively, the touch driver 400 may be mounted on the circuit board 300.

The touch driver 400 may determine whether there is a touch input and may find the coordinates of the touch input by sensing the amount of a change in the capacitance between the touch electrodes. The touch driver 400 may be implemented as an integrated circuit (IC) and may be mounted on the display panel 100 by a chip-on-glass (COG) technique, or a chip-on-plastic (COP) technique.

Figure 4:
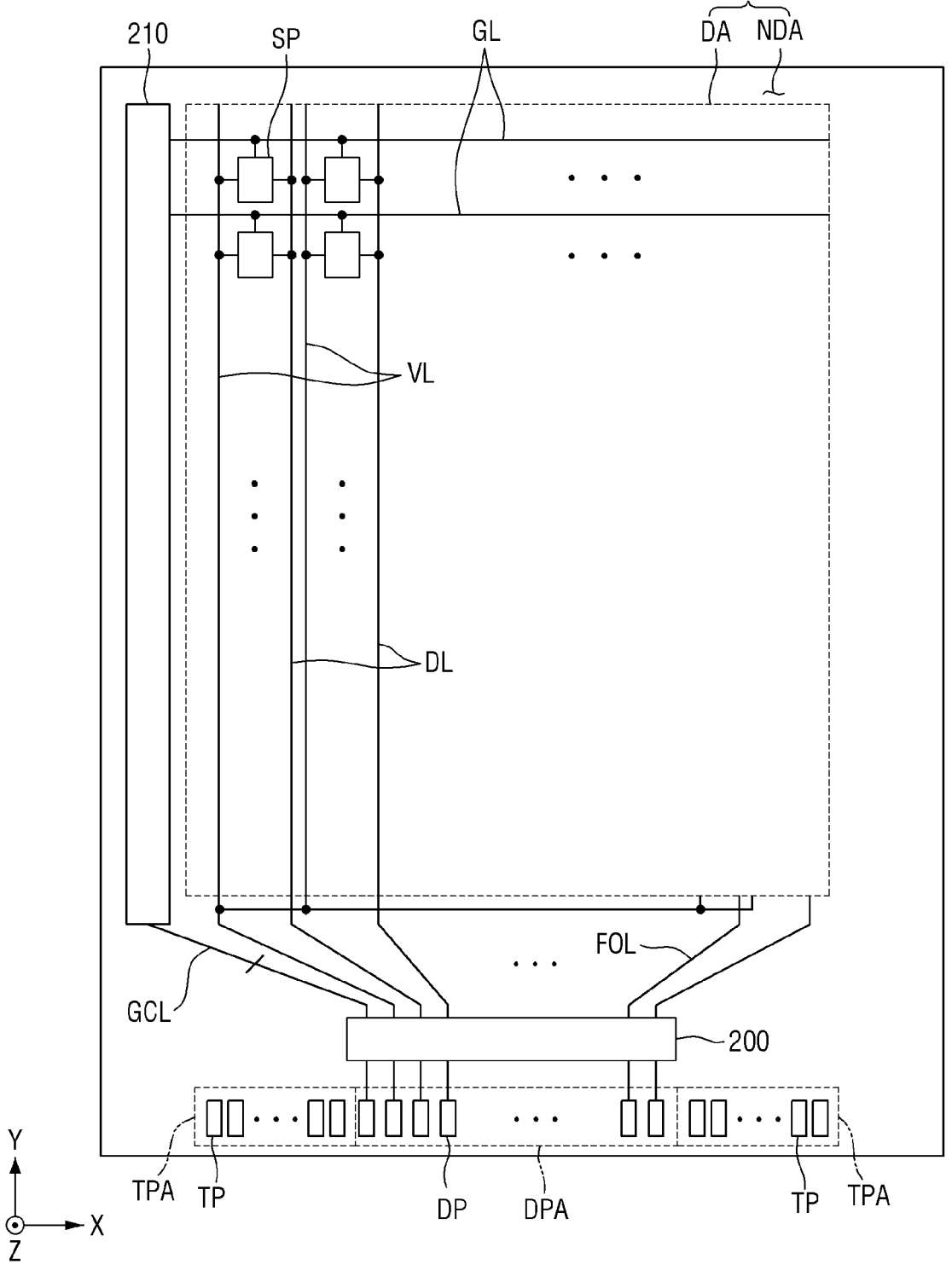
FIG. 4 is a plan view showing the display unit of the display device according to the exemplary embodiment of the present disclosure.

FIG. 3 is a view conceptually showing the display unit and the touch driver according to the exemplary embodiment of the present disclosure. FIG. 4 is a plan view showing the display unit of the display device according to the exemplary embodiment of the present disclosure.

Referring to FIGS. 3 and 4, the display device 10 includes a display panel 100 including a plurality of pixels PX (e.g., SP in FIG. 4), the display driver 200 and the touch driver 400.

The display driver 200 may include a data driver 230 and a display controller 220. Although not shown in the drawings, the display driver 200 may include a gate driver 210. Although the display driver 200 and the gate driver 210 are separate elements in the example shown in the drawings, the present disclosure is not limited thereto.

The display controller 220 may receive input data R. G and B and timing control signals from an external source (e.g., a host). The timing control signals may include a vertical synchronization signal Vsync indicating one frame period, a horizontal synchronization signal Hsync indicating one horizontal period, and a main clock MCLK repeated at a predetermined cycle. The input data R. G and B may be RGB data including red image data, green image data, and blue image data. The display controller 220 may generate output data signals DR. DG and DB and an internal control signal using the input data R. G and B and the timing control signal. The internal control signal includes a data driver control signal DCS and a gate driver control signal GCS.

The display controller 220 may control the operation of the data driver 230 by providing the data driver control signal DCS to the data driver 230. The display controller 220 may control the operation of the gate driver 210 by providing the gate driver control signal GCS to the gate driver 210.

The data driver 230 may receive the output data signals DR, DG and DB and the data driver control signal DCS from the display controller 220. The data driver 230 may generate a data signal using the output data signals DR. DG and DB and the data driver control signal DCS. The data driver 230 may provide the generated data signal to the display panel 100. The data driver 230 may provide data signals to the plurality of pixels PX through a plurality of data lines DL (see FIG. 4) formed in the display panel 100.

The gate driver 210 may receive the gate driver control signal GCS from the display controller 220. The gate driver 210 may generate a gate signal using the received gate driver control signal GCS. The gate driver 210 may provide the generated gate signal to the display panel 100. The gate driver 210 may provide gate signals to the plurality of pixels PX through a plurality of gate lines GL (see FIG. 4) formed in the display panel 100. The plurality of data lines DL (see FIG. 4) and the plurality of gate lines GL (see FIG. 4) will be described in detail later with reference to FIG. 4.

The gate driver 210, the data driver 230 and the display controller 220 may be included in the display driver 200 that controls the operation of the display panel 100. The gate driver 210, the data driver 230 and the display controller 220 may be implemented as integrated circuits (ICs).

The display panel 100 may include a plurality of pixels PX connected to the plurality of data lines DL (see FIG. 4) and the plurality of gate lines GL (see FIG. 4).

A frame frequency at which the display driver 200 drives the display panel 100 may be variable. For example, the frame frequency may vary within the range of 1 Hz to 240 Hz pursuant to a host or a user's selection. The display driver 200 may drive it at 60 Hz for one period and may change the frame frequency to 120 Hz for another period pursuant to a user's needs.

Figure 5:
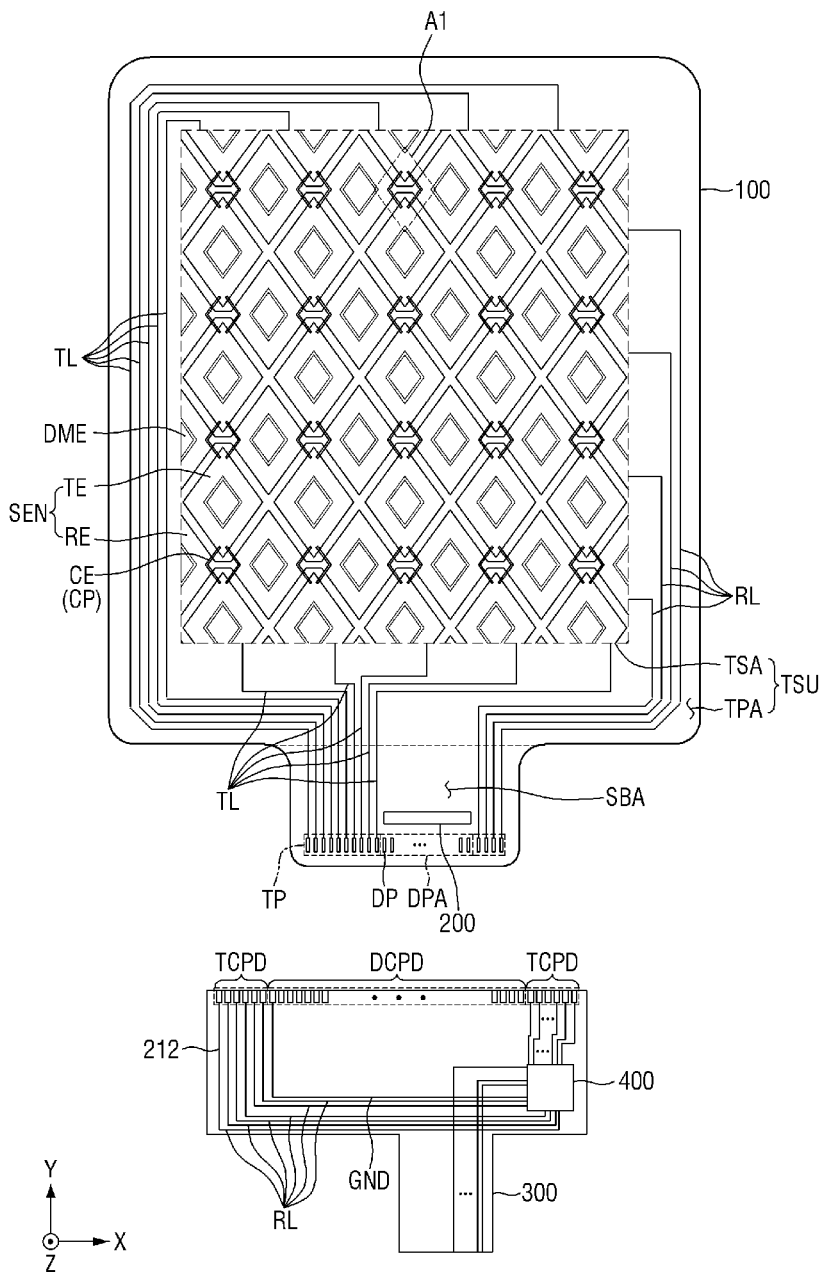
FIG. 5 is a plan view showing the touch unit of the display device according to the exemplary embodiment of the present disclosure.

The touch area TSA may include touch electrodes TE (see FIG. 5), sensing electrodes RE (see FIG. 5), a touch driving lines TL (see FIG. 5) and touch sensing lines RL (see FIG. 5). The touch area TSA may detect a touch input by receiving an electrical signal from the touch driver 400 disposed on the circuit board 300 through the touch driving lines TL or by sending an electrical signal sensed from the sensing electrodes RE to the touch driver 400 through the touch sensing lines RL. Specifically, the touch driver 400 may detect a touch input by converting an analog electrical signal detected by the touch area TSA into a digital signal. The touch driver 400 will be described in detail later with reference to FIG. 5.

Referring to FIG. 4, the display unit DU may include the display area DA and the non-display area NDA. The display unit DU may include a plurality of sub-pixels SP, and a plurality of gate lines GL and a plurality of data lines DL connected to the plurality of sub-pixels SP.

The plurality of gate lines GL may supply the gate signals received from the gate driver 210 to the plurality of sub-pixels SP. The plurality of gate lines GL may be extended in the first direction X and may be spaced apart from one another in the second direction Y intersecting the first direction X.

The plurality of data lines DL may supply the output data signals DR. DG and DB and the data signals received from the display driver 200 to the plurality of sub-pixels SP. The data lines DL may be extended in the second direction Y and may be spaced apart from one another in the first direction X.

The non-display area NDA may surround the display area DA. For example, the non-display area NDA may include the gate driver 210 for applying gate signals to the plurality of scan lines SL, fan-out lines FOL for connecting the plurality of data lines DL with the display driver 200, and display pads DP connected to circuit board 300.

The display driver 200 may supply the gate driver control signal GCS to the gate driver 210 through a gate control line GCL. The gate driver 210 may generate a plurality of gate signals based on the gate driver control signal GCS, and may sequentially supply the plurality of gate signals to the plurality of gate lines GL in a predetermined order.

The display driver 200 may supply a first supply voltage to a first voltage line VL and a second supply voltage to a second voltage line (not shown) through the data driver 230. Each of the plurality of sub-pixels SP may receive the first supply voltage through the first voltage line VL and may receive the second supply voltage through the second voltage line. The first supply voltage may be a predetermined high-level voltage, and the second supply voltage may be a voltage lower than the first supply voltage.

The display pad area DPA and the touch pad area TPA may be disposed at an edge of the display panel 100. The display pad area DPA may include a plurality of display pads DP. The plurality of display pads DP may be connected to a main processor (not shown) through the circuit board 300. The plurality of display pads DP may be connected to the circuit board 300 to receive digital video data and may supply the digital video data to the display driver 200.

FIG. 5 is a plan view showing the touch unit of the display device according to the exemplary embodiment of the present disclosure.

Referring to FIG. 5, the touch unit TSU may include the touch area TSA that senses a user's touch, and a touch peripheral area TPA disposed around the touch area TSA. The touch area TSA may overlap the display area DA of the display panel 100, and the touch peripheral area TPA may overlap the non-display area NDA of the display panel 100.

The touch area TSA may include a plurality of touch electrodes TE, a plurality of sensing electrodes RE, a plurality of touch driving lines TL, and a plurality of touch sensing lines RL.

The circuit board 300 may include first circuit pads DCPD connected to the display pads DP of the display panel 100, second circuit pads TCPD connected to the touch pads TP of the display panel 100, and touch circuit lines 212 connecting the second circuit pads TCPD with the touch driver 400. The touch electrodes TE and the sensing electrodes RE of the touch area TSA may be electrically connected to the touch driver 400 of the circuit board 300. The touch area TSA may receive an electrical signal from the touch driver 400 disposed on the circuit board 300 through the touch driving lines TL and the touch sensing lines RL or may send an electrical signal sensed from the touch electrode TE or the sensing electrodes RE to the touch driver 400 through the touch driving lines RL and the touch sensing lines RL.

The driving electrodes TE may be arranged in the first direction X and in the second direction Y. The driving electrodes TE may be spaced apart from one another in the first direction X and in the second direction Y. The driving electrodes TE adjacent to one another in the second direction Y may be electrically connected through bridge electrodes CE.

The plurality of driving electrodes TE may be connected to the touch pads TP through the touch driving lines TL. Some of the touch driving lines TL may pass the lower side of the touch peripheral area TPA and may be extended to the touch pads TP. Some others of the touch driving lines TL may pass the upper side, the left side and the lower side of the touch peripheral area TPA and may be extended to the touch pads TP. The touch pads TP may be connected to the touch driver 400 through the circuit board 300.

The display pad area DPA and the touch pad area TPA may be disposed at the edge of the subsidiary area SBA of the display panel 100. The display pad area DPA and the touch pad area TPA may be electrically connected to the circuit board 300 by using a low-resistance and high-reliability material such as an anisotropic conductive film.

The sensing electrodes TE may be extended in the first direction X and may be spaced apart from one another in the second direction Y. The sensing electrodes RE may be arranged in the first direction X and the second direction Y, and the sensing electrodes RE adjacent to one another in the first direction X may be electrically connected through connecting portions.

The sensing electrodes RE may be connected to the touch pads TP through the touch sensing lines RL. For example, the plurality of sensing electrodes RE disposed on the right side of the touch area TSA may be connected to the touch pads TP through a plurality of touch sensing lines RL. The touch sensing lines RL may be extended to the touch pads TP via the right side and the lower side of the touch peripheral area TPA. The touch pads TP may be connected to the touch driver 400 through the circuit board 300.

The touch electrodes TE and the sensing electrodes RE may include a planar pattern formed of a transparent conductive layer or may include a mesh pattern employing an opaque metal along regions where the light-emitting elements are not disposed, and thus they do not hinder the progress of lights emitted from the display area DA.

A touch driving signal may be applied from the touch driver 400 to each of the plurality of driving electrodes TE through one of the plurality of touch driving lines TL. When a touch driving signal is applied to the plurality of driving electrodes TE, mutual capacitance may be formed between adjacent driving electrodes TE and sensing electrodes RE. When there is a touch input, the mutual capacitance between adjacent driving electrodes TE and sensing electrodes RE may vary. A change in mutual capacitance between adjacent driving electrodes TE and sensing electrodes RE may be transferred to the touch driver 400 through a plurality of touch sensing lines RL. Accordingly, the touch driver 400 may determine whether there is a touch input and may calculate touch input coordinates of the position, if any. Touch may be sensed by mutual capacitance sensing, but the present disclosure is not limited thereto.

In FIG. 5, a ground line GND may be formed on the circuit board 300.

Dummy electrodes DME are also shown in FIG. 5. A plurality of driving electrodes TE, a plurality of sensing electrodes RE and a plurality of dummy electrodes DME may be disposed on the same layer and may be spaced apart from one another.

Figure 6:
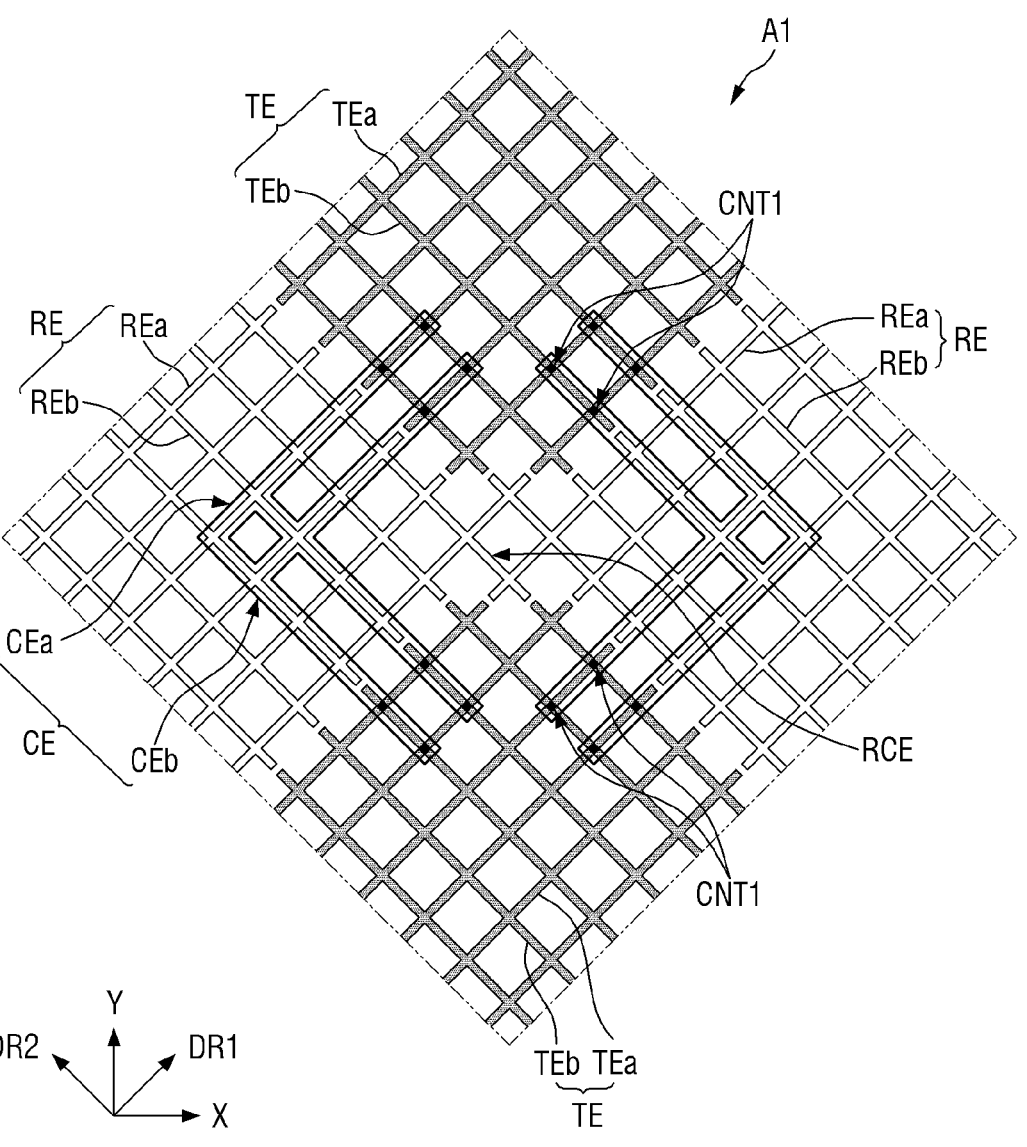
FIG. 6 is an enlarged view of area A1 of FIG. 5.
Figure 7:
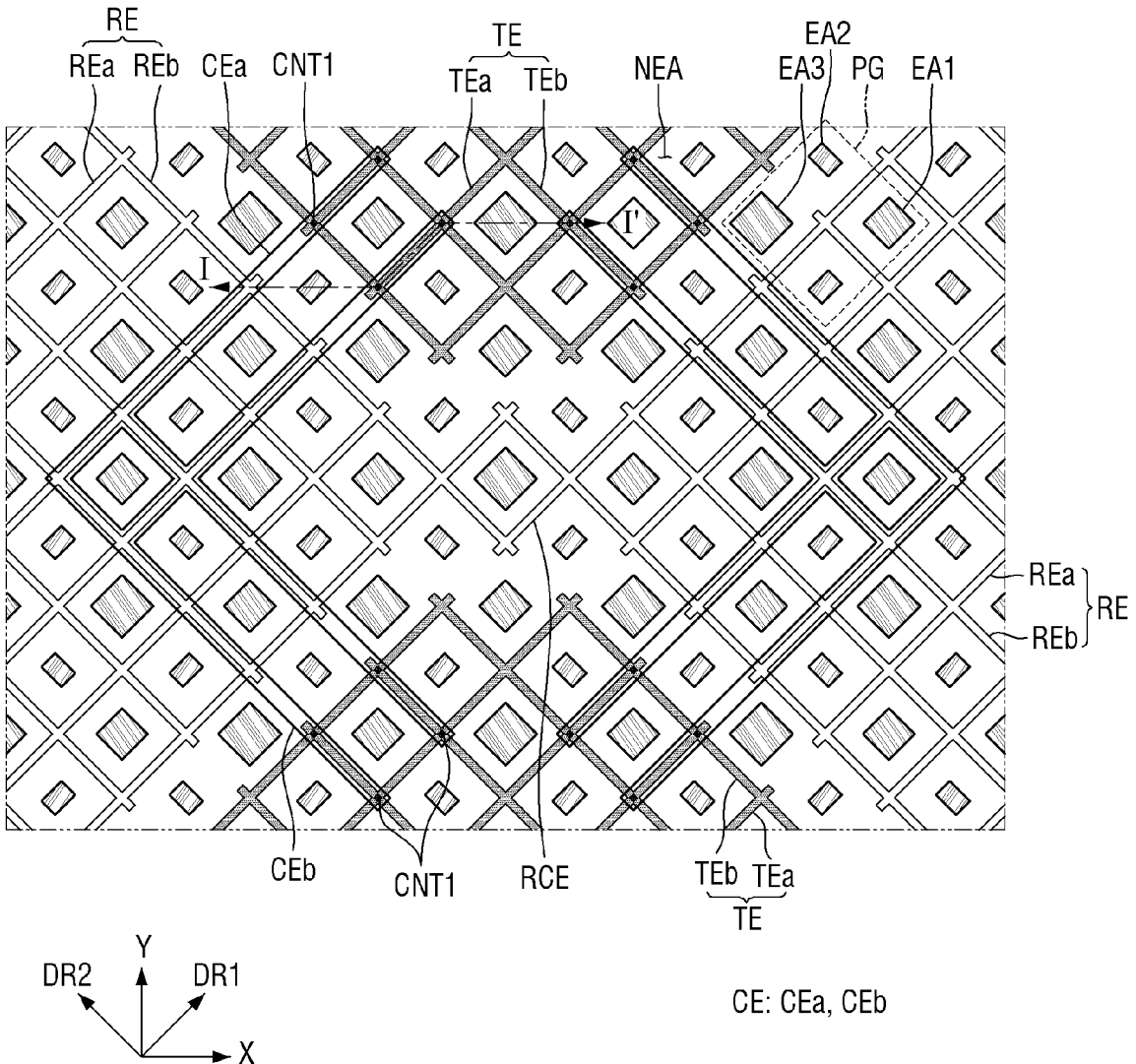
FIG. 7 is an enlarged view showing a part of a display device according to an exemplary embodiment of the present disclosure.

FIG. 6 is an enlarged view of area A1 of FIG. 5. FIG. 7 is an enlarged view showing a part of a display device according to an exemplary embodiment of the present disclosure.

Referring to FIGS. 6 and 7, the driving electrodes TE may be arranged in the first direction X and in the second direction Y. The driving electrodes TE may be spaced apart from one another in the first direction X and in the second direction Y. The driving electrodes TE adjacent to one another in the second direction Y may be electrically connected through bridge electrodes CE.

The sensing electrodes TE may be extended in the first direction X and may be spaced apart from one another in the second direction Y. The sensing electrodes RE may be arranged in the first direction X and the second direction Y, and the sensing electrodes RE adjacent to one another in the first direction X may be electrically connected through connecting portions RCE. For example, the connecting portions RCE of the sensing electrodes RE may traverse between the driving electrodes TE adjacent to each other.

The bridge electrodes CE may be disposed on a different layer from the plurality of driving electrodes TE and the plurality of sensing electrodes RE. Each of the bridge electrodes CE may include a first portion CEa and a second portion CEb. For example, the second portion CEb of the bridge electrode CE may be connected to the driving electrode TE disposed on one side through a first contact hole CNT1 and may be extended in the direction DR2. The first portion CEa of the bridge electrode CE may be bent from the second portion CEb where it overlaps the sensing electrode RE to be extended in a direction DR1, and may be connected to the driving electrode TE disposed on the other side through a first contact hole CNT1. As used herein, the direction DR1 may refer to the direction between the first direction X and the second direction Y, and the direction DR2 may refer to the direction crossing the direction DR1. For example, each of the plurality of bridge electrodes CE may connect between the driving electrodes TE adjacent to each other in the second direction Y.

According to the exemplary embodiment of the present disclosure, the plurality of driving electrodes TE, the plurality of sensing electrodes RE and the plurality of dummy patterns DME (see FIG. 5) may be formed in a mesh or net pattern when viewed from the top. The plurality of driving electrodes TE, the plurality of sensing electrodes RE and the plurality of dummy electrodes DME (see FIG. 5) may not overlap with the first to third emission areas EA1, EA2, and EA3 of the pixels PX. The plurality of bridge electrodes CE may not overlap with the first to third emission areas EA1, EA2 and EA3. Accordingly, the display device 10 can prevent the brightness of the light exiting from the emission areas EA1, EA2 and EA3 from being lowered by the touch unit TSU.

Each of the plurality of driving electrodes TE may include a first portion TEa extended in the direction DR1 and a second portion TEb extended in the direction DR2. Each of the plurality of sensing electrodes RE may include a first portion REa extended in the direction DR1 and a second portion REb extended in the direction DR2.

According to another exemplary embodiment, the plurality of driving electrodes TE, the plurality of sensing electrodes RE and the plurality of dummy patterns DME (see FIG. 5) may be formed as whole surfaces when viewed from the top, instead of a mesh or net pattern. In this case, the plurality of driving electrodes TE, the plurality of sensing electrodes RE and the plurality of dummy electrodes DME (see FIG. 5) may include a transparent conductive material having high light transmittance such as indium tin oxide (ITO) and indium zinc oxide (IZO).

The plurality of pixels PX may include first to third sub-pixels SP. The first to third sub-pixels SP may include first to third light emission areas EA1, EA2 and EA3, respectively. For example, the first emission area EA1 may emit light of a first color or red light, the second emission area EA2 may emit light of a second color or green light, and the third emission area EA3 may emit light of a third color or blue light. It is, however, to be understood that the present disclosure is not limited thereto.

A single pixel PX may include one first emission area EA1, two second emission areas EA2 and one third emission areas EA3 to represent black-and-white/grayscale levels. Accordingly, black-and-white/grayscale levels can be represented by a combination of light emitted from one first emission area EA1, lights emitted from two second emission areas EA2, and light emitted from one third emission areas EA3.

Figure 8:
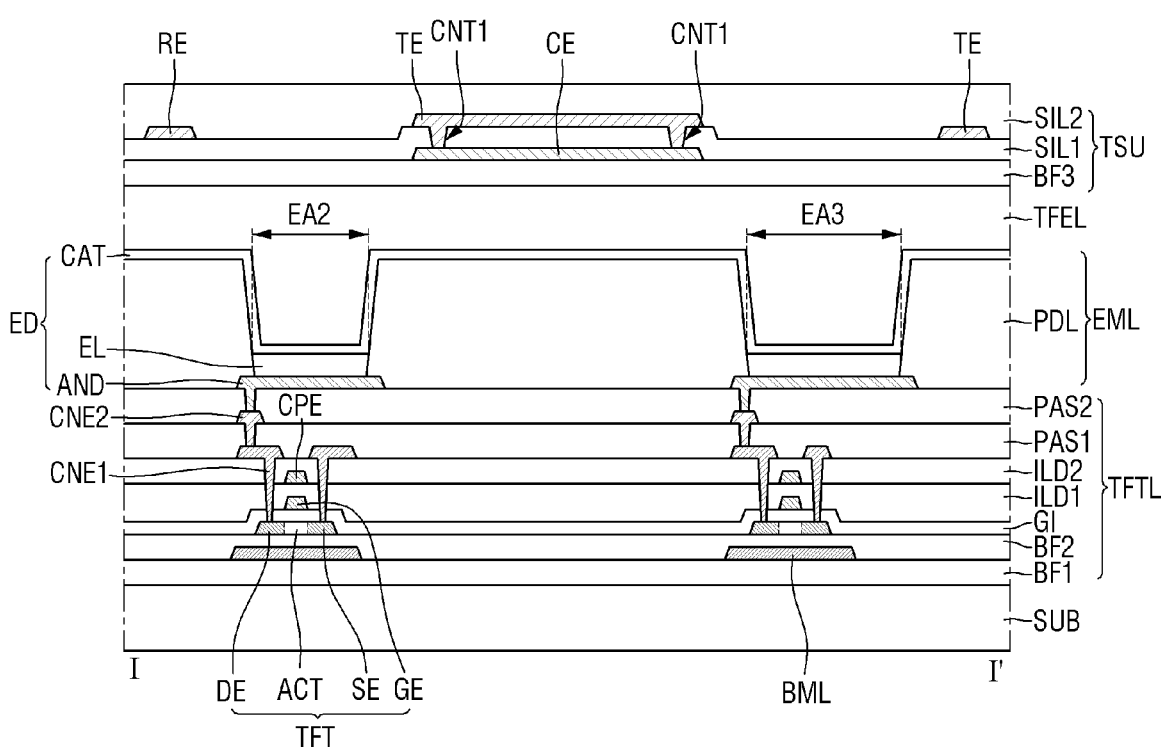
FIG. 8 is a cross-sectional view of the display device according to the exemplary embodiment of the present disclosure, taken along line I-I' of FIG. 7.

FIG. 8 is a cross-sectional view, taken along line I-I' of FIG. 7.

Referring to FIG. 8, the display panel 100 may include the display unit DU and the touch unit TSU. The display unit DU may include a substrate SUB, a thin-film transistor layer TFTL, an emission material layer EML and an encapsulation layer TFEL.

The substrate SUB may support the display panel 100. The substrate SUB may be a base substrate or a base member and may be made of an insulating material such as a polymer resin. For example, the substrate SUB may be a flexible substrate that can be bent, folded, or rolled. As another example, the substrate SUB may include a flexible material and a rigid material.

The thin-film transistor layer TFTL may include first and second buffer layers BF1 and BF2, thin-film transistors TFT, a gate insulator G1, a first interlayer dielectric film ILD1, capacitor electrodes CPE, a second interlayer dielectric film ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic film capable of preventing permeation of air or moisture. For example, the first buffer layer BF1 may include a plurality of inorganic films stacked on one another alternately.

The light-blocking layer BML may be disposed on the first buffer layer BF1. For example, the light-blocking layer BML may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. For another example, the light-blocking layer BML may be an organic layer including a black pigment.

The second buffer layer BF2 may cover the first buffer layer BF1 and the light-blocking layer BML. The second buffer layer BF2 may include an inorganic film capable of preventing permeation of air or moisture. For example, the second buffer layer BF2 may include a plurality of inorganic films stacked on one another alternately.

The thin-film transistor TFT may be disposed on the second buffer layer BF2 and may form a pixel circuit of each of a plurality of pixels. For example, the thin-film transistor TFT may be a driving transistor or a switching transistor of the pixel circuit. The thin-film transistor TFT may include a semiconductor region ACT, a gate electrode GE, a source electrode SE, and a drain electrode DE.

The semiconductor region ACT, the source electrode SE and the drain electrode DE may be disposed on the second buffer layer BF2. The semiconductor region ACT may overlap the gate electrode GE in the thickness direction and may be insulated from the gate electrode GE by the gate insulator G1. The source electrode SE and the drain electrode DE may be formed by converting the material of the semiconductor region ACT into a conductor.

The gate electrode GE may be disposed on the gate insulator G1. The gate electrode GE may overlap the semiconductor region ACT with the gate insulator G1 interposed therebetween.

The gate insulator G1 may be disposed on the semiconductor region ACT, the source electrode SE and the drain electrode DE. For example, the gate insulator G1 may cover the semiconductor region ACT, the source electrode SE, the drain electrode DE and the second buffer layer BF2, and may insulate the semiconductor region ACT from the gate electrode GE. The gate insulator G1 may include a contact hole through which the first connection electrode CNE1 passes.

The first interlayer dielectric layer ILD1 may cover the gate electrode GE and the gate insulator G1. The first interlayer dielectric layer ILD1 may include a contact hole through which the first connection electrode CNE1 passes. The contact hole of the first interlayer dielectric layer ILD1 may be connected to the contact hole of the gate insulator G1 and the contact hole of the second interlayer dielectric layer ILD2.

The capacitor electrode CPE may be disposed on the first interlayer dielectric layer ILD1. The capacitor electrode CPE may overlap with the gate electrode GE in the third direction (z-axis direction).

The second interlayer dielectric film ILD2 may cover the capacitor electrode CPE and the first interlayer dielectric film ILD1. The second interlayer dielectric film ILD2 may include a contact hole through which the first connection electrode CNE1 passes. The contact hole of the second interlayer dielectric film ILD2 may be connected to the contact hole of the first interlayer dielectric film ILD1 and the contact hole of the gate insulator G1.

The first connection electrode CNE1 may be disposed on the second interlayer dielectric film ILD2. The first connection electrode CNE1 may connect the drain electrode DE of the thin-film transistor TFT with the second connection electrode CNE2. The first connection electrode CNE1 may be inserted into a contact hole formed in the second interlayer dielectric layer ILD2, the first interlayer dielectric layer ILD1, and the gate insulator G1 to be in contact with the drain electrode DE of the thin-film transistor TFT.

The first passivation layer PAS1 may cover the first connection electrode CNE1 and the second interlayer dielectric layer ILD2. The first passivation layer PAS1 can protect the thin-film transistor TFT. The first passivation layer PAS1 may include a contact hole through which the second connection electrode CNE2 passes.

The second connection electrode CNE2 may be disposed on the first passivation layer PAS1. The second connection electrode CNE2 may connect the first connection electrode CNE1 with a first electrode AND of a light-emitting diode ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation PAS2 may include a contact hole through which the first electrode AND of the light-emitting diode ED passes.

The emission material layer EML may be disposed on the thin-film transistor layer TFTL. The emission material layer EML may include a light-emitting diode ED and a pixel-defining film PDL. The light-emitting diode ED may include a first electrode AND, an emissive layer EL, and a second electrode CAT.

The first electrode AND may be disposed on the second passivation layer PAS2. The first electrode AND may be disposed to overlap with one of the first to third emission areas EA1, EA2 and EA3 defined by the pixel-defining film PDL. The first electrode AND may be connected to the drain electrode DE of the thin-film transistor TFT through the first and second connection electrodes CNE1 and CNE2.

The emissive layer EL may be disposed on the first electrode AND. For example, the emissive layer EL may be, but is not limited to, an organic emissive layer made of an organic material. If the emissive layer EL is an organic emissive layer, when the thin-film transistor applies a predetermined voltage to the first electrode AND of the light-emitting diode ED and the second electrode CAT of the light-emitting diode ED receives a common voltage or cathode voltage, the holes and electrons may move to the organic emissive layer EL through the hole transporting layer and the electron transporting layer, respectively, and they combine in the organic layer E to emit light.

The second electrode CAT may be disposed on the emissive layer EL. For example, the second electrode CAT may be implemented as an electrode that commonly covers all the pixels, instead of being disposed as a separated electrode for each of the pixels. For example, the second electrode CAT may be disposed on the emissive layer EL in the first to third emission areas EA1, EA2 and EA3, and may be disposed on the pixel-defining layer PDL in the other areas than the first to third emission areas EA1, EA2 and EA3.

The pixel-defining film PDL may define first to third emission areas EA1, EA2 and EA3. The pixel-defining layer PDL may separate and insulate the first electrode AND of one of the plurality of light-emitting elements ED from the anode electrode of another one of the light-emitting elements ED.

The encapsulation layer TFEL may be disposed on the second electrode CAT to cover the light-emitting diodes ED. The encapsulation layer TFEL may include at least one inorganic layer to prevent permeation of oxygen or moisture into the emission material layer EML. The encapsulation layer TFEL may include at least one organic layer to protect the emission material layer EML from foreign substances such as dust.

The touch unit TSU may be disposed on the encapsulation layer TFEL. The touch unit TSU may include a third buffer layer BF3, a bridge electrode CE, a first insulating layer SIL1, a driving electrode TE, a sensing electrode RE, and a second insulating layer SIL2.

The third buffer layer BF3 may be disposed on the encapsulation layer TFEL. The third buffer layer BF3 may be insulating and may have optical functions. The third buffer layer BF3 may include at least one inorganic layer. Optionally, the third buffer layer BF3 may be eliminated.

The bridge electrode CE may be disposed on the third buffer layer BF3. The bridge electrode CE may be disposed on a different layer from the driving electrodes TE and the sensing electrodes RE, and may connect between the driving electrodes TE adjacent to each other in the second direction (e.g., the second direction Y in FIG. 7). For example, the bridge electrode CE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The first insulating layer SIL1 may cover the bridge electrode CE and the third buffer layer BF3. The first insulating layer SIL1 may have insulating and optical functionalities. For example, the first insulating layer SIL1 may be formed of an inorganic layer, e.g., a silicon nitride layer, a silicon oxynitride layer, a silicon oxide layer, a titanium oxide layer, or an aluminum oxide layer.

The driving electrodes TE and the sensing electrodes RE may be disposed on the first insulating layer SIL1. Each of the driving electrodes TE and the sensing electrodes RE may overlap with none of the first to third emission areas EA1. EA2 and EA3. Each of the driving electrodes TE and the sensing electrodes RE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy, or a stack structure of an APC alloy and ITO (ITO/APC/ITO).

The second insulating layer SIL2 may cover the driving electrode TE, the sensing electrode RE and the first insulating layer SIL1. The second insulating layer SIL2 may have insulating and optical functionalities. The second insulating layer SIL2 may be made of one of the above-listed materials as the material of the first insulating layer SIL1.

Figure 9:
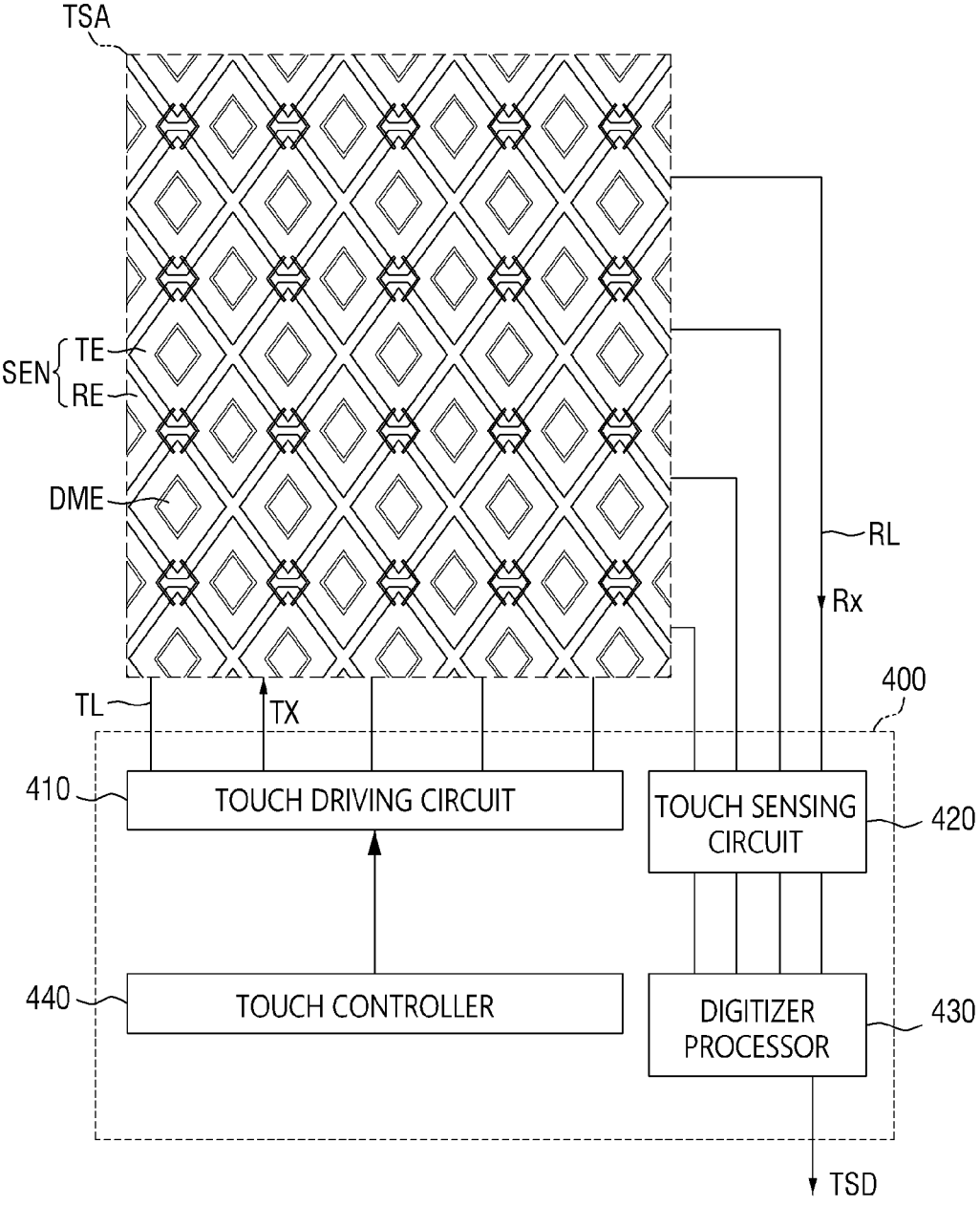
FIG. 9 is a block diagram showing the touch driver of the display device according to the exemplary embodiment of the present disclosure.

FIG. 9 is a block diagram showing the touch driver of the display device according to the exemplary embodiment of the present disclosure.

Referring to FIG. 9, the touch driver 400 (e.g., touch detection device) may include a touch driving circuit 410, a touch sensing circuit 420, a digital processor 430, and a touch controller 440.

The touch driving circuit 410 may be connected to the plurality of driving electrodes TE through the touch driving lines TL. The touch driving circuit 410 may supply touch driving signals TX to the plurality of driving electrodes TE. The touch driving signals may be multiple driving signals generated based on an orthogonal frequency division multiplexing (OFDM) scheme and a code division multiple access (CDMA) scheme. For example, the touch driving circuit 410 may simultaneously output the touch driving signals from the driving electrodes TE disposed on one side of the touch area TSA to the driving electrodes TE disposed on the opposite side of the touch area TSA.

The touch sensing circuit 420 may be connected to the plurality of sensing electrodes RE through the touch sensing lines RL. The touch sensing circuit 420 may sense a change in mutual capacitance between the driving electrodes TE and the sensing electrodes RE through the touch sensing lines RL. For example, the touch sensing circuit 420 may include an integrating circuit including at least one operational amplifier and a capacitor having a predetermined capacitance for sensing a change in capacitance from the sensing electrodes RE of the touch unit TSU.

The touch sensing circuit 420 may include a capacitor, a switch, a resistor, an amplifier, and a sampling-and-holder. It should be noted that the implementation of the touch sensing circuit 420 is not particularly limited herein. For example, the voltage corresponding to the charges stored in the capacitor may be sampled and then held by the sampling-and-holder for a certain period of time.

The touch sensing circuit 420 may receive a touch signal RX (e.g., touch sensing data) through the touch sensing lines RL. The touch signal RX may be an analog signal having a plurality of driving pulses. The touch signal RX may be, but is not limited to, a sine wave, a pulse wave, or a ramp wave having a frequency (or period). The touch sensing circuit 420 may output the touch signal RX including an analog signal to the digital processor 430.

The digital processor 430 may receive the touch signal RX from the touch sensing circuit 420. The digital processor 430 may determine that there is a touch input if the sensing voltage of the touch signal RX is greater than a predetermined value. The digital processor 430 may generate touch data TSD if it is determined that there is a touch input.

The touch controller 440 may control the overall operation of the touch driver 400. The touch controller 440 can control the driving frequency and driving code of the touch driving circuit 410. The touch controller 440 may output a frequency control signal for controlling the driving frequency of the touch driving circuit 410 to the touch driving circuit 410. The touch controller 440 may control driving timing for synchronization of the touch driving circuit 410, the touch sensing circuit 420 and the digital processor 430.

Figure 10:
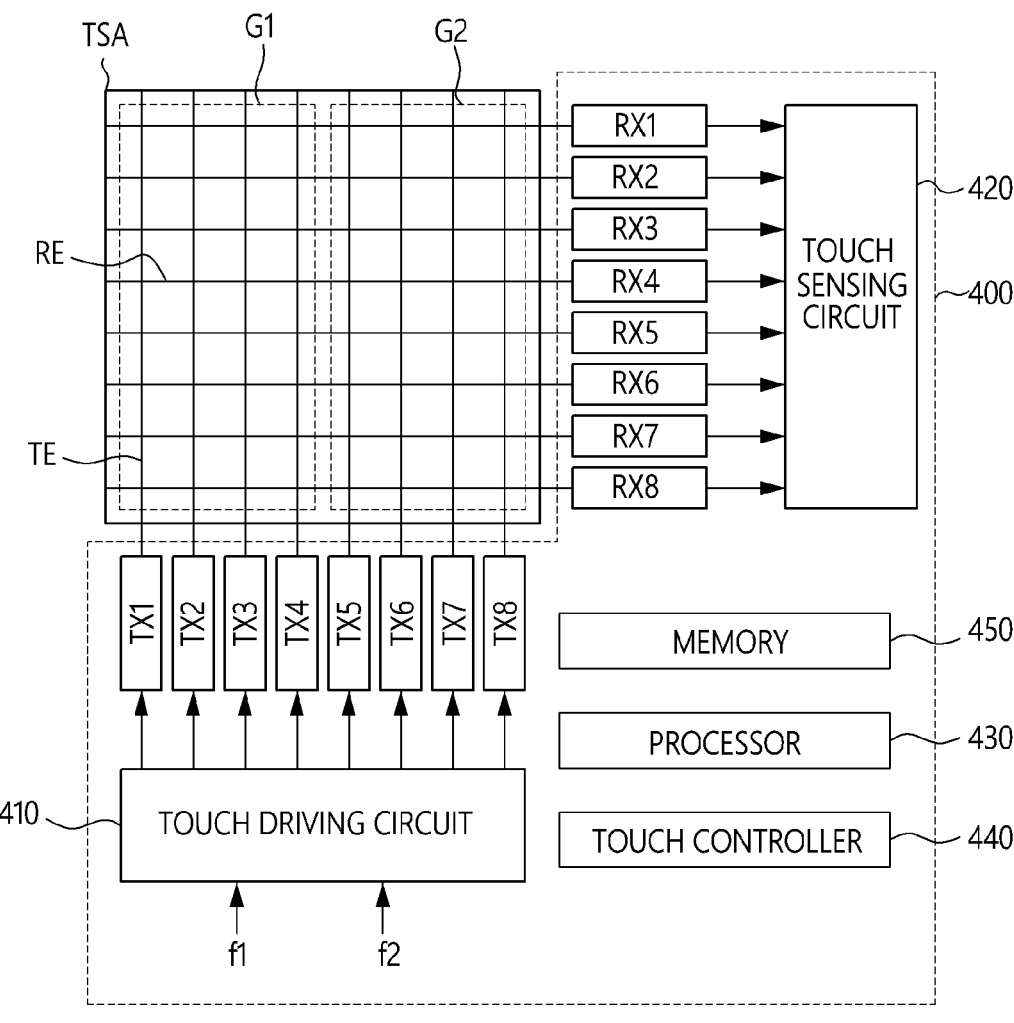
FIG. 10 is a block diagram illustrating the touch driver shown in FIG. 9 in more detail.

FIG. 10 is a block diagram illustrating the touch driver 400 shown in FIG. 9 in more detail.

Referring to FIG. 10, the touch driver 400 (e.g., touch detection device) may include the touch driving circuit 410, the touch sensing circuit 420, the digital processor 430, the touch controller 440, and a memory 450.

The touch driving circuit 410 may be electrically connected to the plurality of driving electrodes TE. The touch driving circuit 410 may include a plurality of driving channels TXC connected to the plurality of driving electrodes TE. The touch driving circuit 410 may output multiple driving signals DS1 to DS8 to the plurality of driving electrodes TE through the plurality of driving channels TXC.

Although the touch area TSA includes eight driving electrodes TE in the example shown in FIG. 10, this is merely illustrative. When the touch area TSA includes eight driving electrodes TE, the touch driving circuit 410 may include eight driving channels TX1 to TX8 connected to the eight driving electrodes TE, respectively.

The touch driving circuit 410 may drive the plurality of driving electrodes TE disposed in the touch area TSA by dividing them into a plurality of groups including a first group G1 and a second group G2. The touch driving circuit 410 may drive the plurality of driving electrodes TE disposed in the touch area TSA by dividing them into a first group G1 and a second group G2. It should be understood, however, that the present disclosure is not limited thereto. Among the plurality of driving electrodes TE, the number of driving electrodes TE belonging to the first group G1 may be equal to the number of driving electrodes TE belonging to the second group G2. For example, the touch area TSA may include eight driving electrodes TE, and each of the first group G1 and the second group G2 may include four driving electrodes TE.

The touch driving circuit 410 may generate first driving signals DS1 to DS4 based on the OFDM scheme and the CDMA scheme, and may supply the generated first driving signals DS1 to DS4 to the driving electrodes TE of the first group G1. The touch driving circuit 410 may generate second driving signals DS5 to DS8 based on the OFDM scheme and the CDMA scheme, and may supply the generated second driving signals DS5 to DS8 to the driving electrodes TE of the second group G2. The touch driving circuit 410 may simultaneously output the first driving signals DS1 to DS4 and the second driving signals DS5 to DS8.

The touch driving circuit 410 may generate first driving signals DS1 to DS4 based on a designated first frequency and first orthogonal codes respectively associated with the driving electrodes TE of the first group G1. The touch driving circuit 410 may generate second driving signals DS5 to DS8 based on a designated second frequency orthogonal to the first frequency and second orthogonal codes respectively associated with the driving electrodes TE of the second group G2. The touch controller 440 may acquire information on the first frequency and the second frequency by looking up the memory 450, and may output a first sine wave f1 and a second sine wave f2 corresponding to the first frequency and the second frequency, respectively, to the touch driving circuit 410. The touch controller 440 may receive the first orthogonal codes and the second orthogonal codes by looking up the memory 450, and may control the touch driving circuit 410 so that it generates driving signals DS1 to DS8 using the first orthogonal codes and the second orthogonal codes.

The first frequency and the second frequency may be frequencies according to an OFDM scheme and may be spaced such that they are orthogonal to each other when modulated. This means that when the first and second frequencies are each modulated, the resulting spectrums may partially overlap but do not interfere with one another. (This is explained later in connection with FIG. 12.) The touch driving circuit 410 may use a plurality of frequencies orthogonal to one another based on the number of groups dividing the touch area TSA. For instance, in another example, the touch driving circuit 410 may divide the driving electrodes TE disposed in the touch area TSA into four groups. In this case, the touch driving circuit 410 may generate driving signals using four frequencies which are spaced to be orthogonal to one another.

The first orthogonal codes and the second orthogonal codes may be assigned to the plurality of driving channels TXC connected with the plurality of driving electrodes TE of the touch area TSA, respectively. The first orthogonal codes may be orthogonal codes assigned to the driving channels of the first group G1 connected to the driving electrodes TE of the first group G1, and may include data based on Walsh codes that are orthogonal to one another. The second orthogonal codes may be orthogonal codes assigned to the driving channels of the second group G2 connected to the driving electrodes TE of the second group G2, and may include data based on Walsh codes that are orthogonal to one another. For example, the first orthogonal codes and the second orthogonal codes may be CDMA-based orthogonal codes. For example, the first orthogonal codes and the second orthogonal codes may include data based on Walsh codes orthogonal to one another. For example, the first orthogonal codes and the second orthogonal codes may be codes based on the CDMA scheme and may include the value of 1 or −1. Herein, the value of 1 may refer to non-inversion of a phase, and the value of −1 may refer to inversion of a phase.

The touch sensing circuit 420 may be electrically connected to the plurality of sensing electrodes RE. As described above, as the sensing electrodes RE are disposed such that they cross the driving electrodes TE disposed in the touch area TSA, a plurality of touch nodes may be formed at their intersections. The touch sensing circuit 420 may include a plurality of sensing channels RXC connected to the plurality of sensing electrodes RE. The touch sensing circuit 420 may receive touch sensing data from the plurality of sensing electrodes RE through the plurality of sensing channels RXC. The touch sensing circuit 420 may sense a change in the capacitance of each of the plurality of touch nodes through the sensing electrodes RE while the touch driving circuit 410 supplies the driving signals to the driving electrodes TE.

Although the touch area TSA includes eight sensing electrodes RE in the example shown in FIG. 10, this is merely illustrative. When the touch area TSA includes eight sensing electrodes RE, the touch driving circuit 410 may include eight sensing channels connected to the eight sensing electrodes RE, respectively.

The touch sensing circuit 420 may acquire touch sensing data from the plurality of sensing electrodes RE, and may perform demodulation according to the OFDM scheme and the CDMA scheme on the acquired touch sensing data. The touch sensing circuit 420 may supply the demodulated touch sensing data to the digital processor 430.

Figure 11:
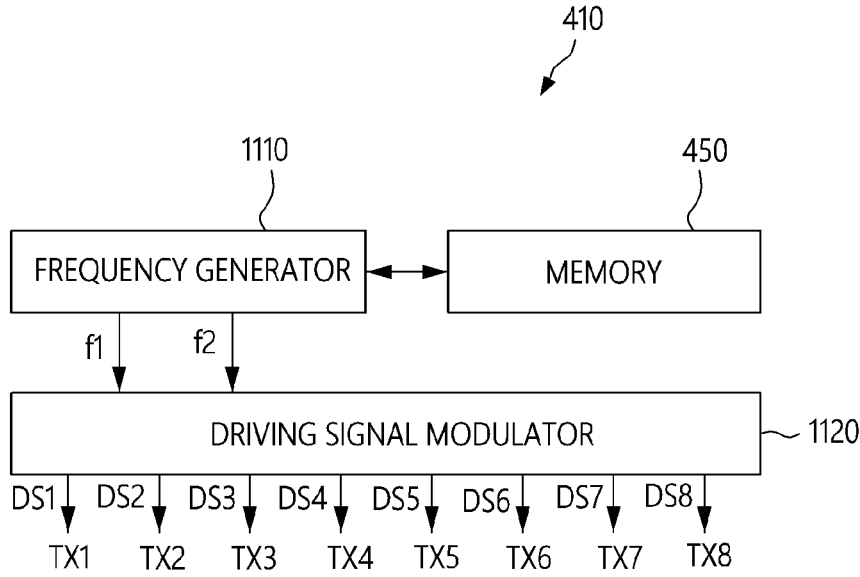
FIG. 11 is a block diagram illustrating the touch driving circuit shown in FIG. 10.
Figure 12:
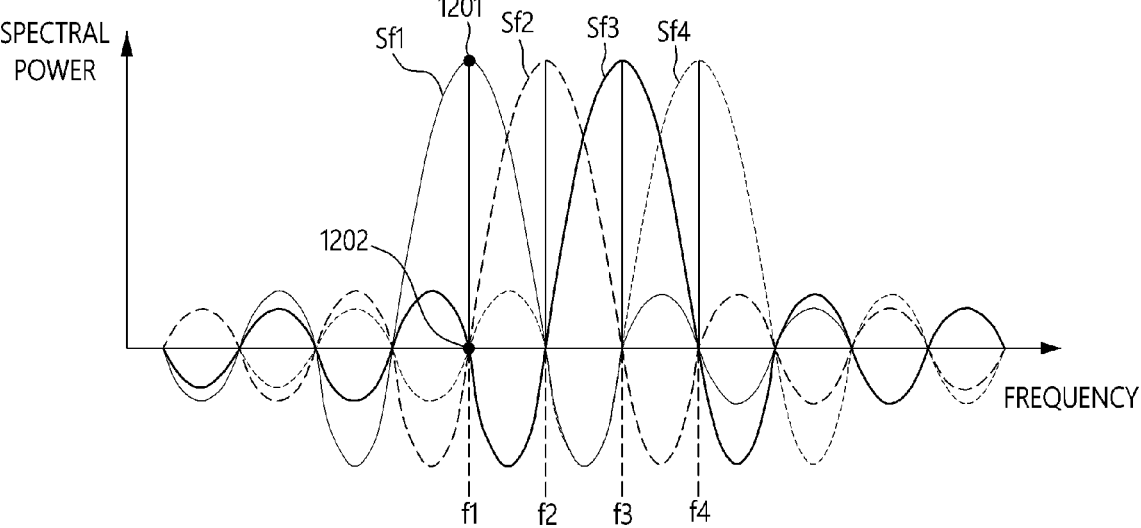
FIG. 12 is graph of spectral power vs. frequency for examples of waveforms generated using respective sine waves generated by a frequency generator 1110 according to an exemplary embodiment.
Figure 13:
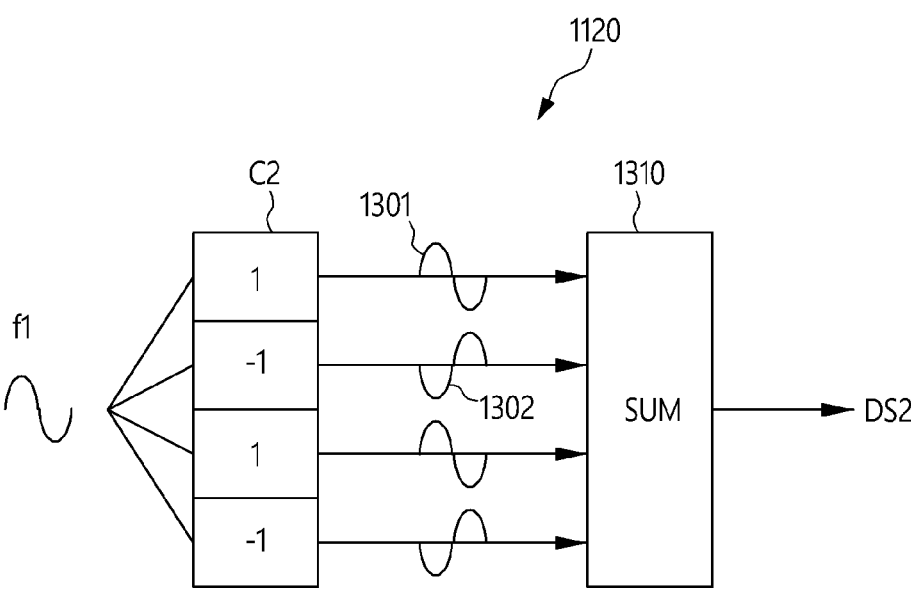
FIG. 13 is an example for illustrating the operation of a driving signal modulator shown in FIG. 11.
Figure 14:
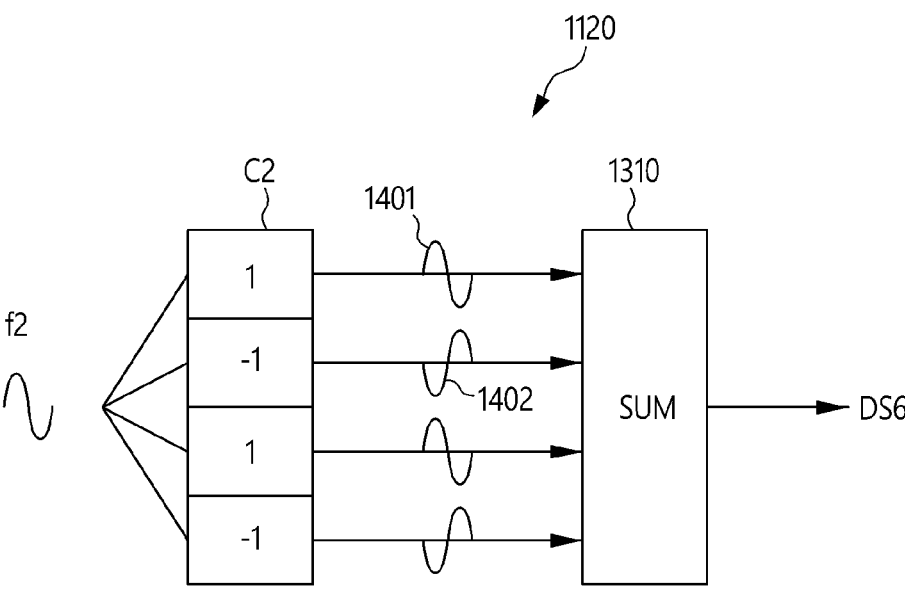
FIG. 14 is another example for illustrating the operation of a driving signal modulator shown in FIG. 11.

FIG. 11 is a block diagram illustrating the touch driving circuit 410 shown in FIG. 10. FIG. 12 illustrates spectral power of an example of a first modulated carrier wave (hereafter, just "carrier") sf1 and a second carrier sf2 generated with a frequency generator 1110 according to an exemplary embodiment. FIG. 13 is an example for illustrating the operation of a driving signal modulator 1120 shown in FIG. 11. FIG. 14 is another example for illustrating the operation of the driving signal modulator 1120 shown in FIG. 11. Hereinafter, a method of generating, by the touch driving circuit 410 according to the exemplary embodiment, first driving signals DS1 to DS4 and second driving signals DS5 to DS8 based on an OFDM scheme and a CDMA scheme will be described with reference to FIGS. 11 to 14. Herein, an "OFDM scheme" encompasses a scheme for generating orthogonal carriers, but not necessarily in a conventional OFDM manner. With conventional OFDM, a data stream is generally divided into n-bit segments which are distributed among multiple sub-carriers. The data stream is transmitted by modulating each sub-carrier with a complex signal representing the respective n-bit segment. The modulated sub-carriers are combined and transmitted (typically through use of an Inverse Fast Fourier Transform (IFFT) algorithm to generate a complex waveform), and then on the receiving side, the original data stream is reconstructed in a reverse process typically using an FFT algorithm. On the other hand, an OFDM scheme herein may generate orthogonal carriers without the use of data stream segmentation and an IFFT on the transmit side and data stream reconstruction on the receive side. Herein, the orthogonal carriers may each be modulated by CDMA codes and individually analyzed on the receiver side to determine the precise location of a touch input that is detected to be associated with one of the carriers.

Referring to FIG. 11, the touch driving circuit 410 according to the exemplary embodiment may include the frequency generator 1110 and the driving signal modulator 1120.

The frequency generator 1110 of the touch driving circuit 410 may generate a plurality of carriers based on a plurality of designated frequencies retrieved from the memory 450. The frequency generator 1110 may set a number of frequencies equal to the number of groups of driving electrodes TE of the touch area TSA divided by the touch driver 400. The plurality of frequencies generated by the frequency generator 1110 may have phases orthogonal to one another. For example, as shown in FIG. 12, carriers generated by the frequency generator 1110 may have phases orthogonal to one another. Herein, carriers (or frequencies) that are described as being orthogonal to one another or that have "phases orthogonal to one another" may mean that they have no correlation with one another. For example, FIG. 12 shows a first frequency f1, a second frequency f2, a third frequency f3 and a fourth frequency f4 generated by the frequency generator 1110 each of which may be uniformly modulated (e.g., by a square wave) to produce first through fourth carriers sf1 to sf4, respectively. Each of the carriers sf1 to sf4 may be orthogonal to one another. Each of the carriers sf1 to sf4 (which may also be referred to interchangeably as signals or waveforms) may have spectral power distributed vs. frequency in the form of a sinc function, where a peak of each carrier coincides with nulls of all the other carriers. With suitable spacing between adjacent frequencies f1 to f4 (e.g., set in accordance with a symbol rate for modulating the frequencies), when the amplitude of one of the first to fourth carriers sf1 to sf4 has the maximum value at a frequency, the signal strength of the other carriers may have the value of zero at that frequency. Accordingly, the carriers generated by the frequency generator 1110 (as initially modulated by the frequency generator 1110 or within the driving signal modulator 1120, prior to applying CDMA codes) may be signals orthogonal to one another, and independent of one another. For instance, in FIG. 12, the first carrier sf1 has the maximum amplitude at frequency f1 as indicated by the point 1201. At frequency f1, the other carriers sf2 to sf4 may have the signal strength of zero as indicated by the point 1202. Thus, it may be understood in general that a first carrier is orthogonal to a second carrier of a multi-carrier signal, such as a signal including the carriers sf1 to sf4, when the frequency (e.g., f1) at which the first carrier has a maximum amplitude is also a frequency at which the second carrier has a minimum amplitude, and vice versa (e.g., carrier sf2 has a peak amplitude at f2, and carrier sf1 has a minimum amplitude at f2). Herein, such orthogonality of signals may be equivalently expressed in connection with carriers or driving signals "based on a first frequency f1" and carriers or driving signals "based on a second frequency f2", e.g., with the phrase "frequencies f1 and f2 are orthogonal", or the like.

According to an exemplary embodiment of the present disclosure, the touch driving circuit 410 "divides the touch area TSA into two groups", a first group G1 and a second group G2 to drive them. Herein, when the touch driving circuit 410 is said to "divide the touch area into groups", the touch driving circuit 410 may supply signals with different characteristics (e.g., different respective frequencies) to the respective groups.

In this instance, the frequency generator 1110 may generate a first carrier sf1, e.g., a time limited or modulated sinusoidal signal having peak amplitude at frequency f1, for driving the driving electrodes TE belonging to the first group G1, and a second carrier sf2, having peak amplitude at frequency f2, for driving the driving electrodes TE of the second group G2. The first carrier sf1 may be orthogonal to the second carrier sf2 (equivalently, "frequency f1 may be orthogonal to frequency f2"). Although the touch driving circuit 410 divides the touch area TSA into two groups G1 and G2 to drive them according to the exemplary embodiments of the present disclosure, this is merely illustrative. According to an exemplary embodiment of the present disclosure the touch driving circuit 410 may drive the touch area TSA by dividing it into k groups, where k is an integer greater than two.

The driving signal modulator 1120 may receive carriers sf1 and sf2 orthogonal to each other from the frequency generator 1110. The driving signal modulator 1120 may multiply the received carriers sf1 and sf2 by the designated orthogonal codes to generate the first driving signals DS1 to DS4 and the second driving signals DS5 to DS8 modulated according to the CDMA scheme. The driving signal modulator 1120 may output the generated first driving signals DS1 to DS4 and second driving signals DS5 to DS8 through a plurality of driving channels TXC.

According to the exemplary embodiment, the first driving signals DS1 to DS4 may be signals supplied in parallel (and simultaneously) to the driving electrodes TE of the first group G1 through the first to fourth driving channels. For example, the first driving signals DS1 to DS4 may include a first driving signal input to the first driving channel, a second driving signal input to the second driving channel, a third driving signal input to the third driving channel, and a fourth driving signal input to the fourth driving channel. It should be noted that the first to fourth driving signals are signals each commonly based on the first frequency, but may have different forms by being multiplied by different orthogonal codes (i.e., first orthogonal codes).

According to the exemplary embodiment, the second driving signals DS5 to DS8 may be parallel signals supplied to the driving electrodes TE of the second group G2 through the fifth to eighth driving channels. For example, the second driving signals DS5 to DS8 may include a fifth driving signal input to the fifth driving channel, a sixth driving signal input to the sixth driving channel, a seventh driving signal input to the seventh driving channel, and an eighth driving signal input to the eighth driving channel. It should be noted that the fifth to eighth driving signals are each commonly based on the second frequency, but may have different forms by being multiplied by different orthogonal codes (i.e., second orthogonal codes).

According to various exemplary embodiments, the driving electrodes TE of the first group G1 may include n driving electrodes TE. The driving electrodes TE of the second group G2 may include m driving electrodes TE, where m may be an integer equal to n in some embodiments, and unequal to n in other embodiments. The first orthogonal codes may be associated with the driving electrodes TE of the first group G1, respectively, and may include different code values. For example, the first orthogonal codes may be associated with the driving channels of the first group G1, respectively, and may include the first to nth codes associated with the n driving electrodes TE (corresponding to the n driving channels) belonging to the first group G1, respectively. The first to nth codes may include data based on Walsh codes orthogonal to one another.

Table 1 shows first to fourth codes as an example of first orthogonal codes based on Walsh codes. The first orthogonal codes shown in Table 1 are merely an example and may be changed in a variety of ways.

TABLE 1

| First Orthogonal Code | Code Value |
| --- | --- |
| First Code | 1, 1, 1, 1 |
| Second Code | 1, −1, 1, −1 |
| Third Code | 1, 1, −1, −1 |
| Fourth Code | 1, −1, −1, 1 |

Referring to Table 1, the first orthogonal codes may include four orthogonal codes under the assumption that each group includes four driving channels. For example, the first orthogonal codes may have orthogonality, i.e., an integer value is obtained when they are multiplied by their own code value, while zero is obtained when they are multiplied by different code values. Herein, the code value of 1 may refer to non-inversion of a phase, and the code value of −1 may refer to inversion of a phase. The driving signal modulator 1120 may generate a first driving signal by multiplying the first sine wave (frequency) f1 by the first code. The driving signal modulator 1120 may generate a second driving signal by multiplying the first sine wave f1 by the second code. The driving signal modulator 1120 may generate a third driving signal by multiplying the first sine wave f1 by the third code. The driving signal modulator 1120 may generate a fourth driving signal by multiplying the first sine wave f1 by the fourth code. For example, FIG. 13 shows that a second driving signal DS2 is generated by multiplying, by the driving signal modulator 1120, the first sine wave f1 by a second code C2. According to the example shown in the drawings, the driving signal modulator 1120 may output the first sine wave f1 without inverting it when the code value is 1 as indicated by reference numeral 1301. According to the example shown in the drawings, the driving signal modulator 1120 may output the first sine wave f1 by inverting it when the code value is −1 as indicated by reference numeral 1302. According to the example shown in FIG. 13, the driving signal modulator 1120 may include a synthesis module 1310 that synthesizes and outputs the first sine waves f1 multiplied by first orthogonal codes. The synthesis module 1310 may synthesize inverted or non-inverted first sine waves f1 depending on the code values of the first orthogonal codes and output the synthesized first sine waves f1 to the driving channels. As a function of time, in the example of FIG. 13, the resulting driving signal DS2 may include a temporal sequence of a non-inverted sine wave f1 (e.g., as 1301) for a certain time period (corresponding to a number of sine wave cycles), followed by an equal time period of an inverted sine wave f1 (e.g., as 1302), followed by an equal time period of the non-inverted sine wave f1 (e.g., as 1301), and lastly followed by an equal time period of the inverted sine wave f1 (e.g., as 1302). This temporal sequence may be continually repeated.

The second orthogonal codes may be associated with the driving electrodes TE of the second group G2, respectively, and may include different code values. For example, the second orthogonal codes may be associated with the driving channels of the second group G2, respectively, and may include the first to m$^{th}$ codes associated with the m driving electrodes TE (corresponding to the m driving channels) belonging to the second group G2, respectively. The first to m$^{th}$ codes may include data based on Walsh codes orthogonal to one another. According to the exemplary embodiment of the present disclosure, the second orthogonal codes may be substantially identical to the first orthogonal codes. For example, the second orthogonal codes may include the first to fourth codes described above with reference to Table 1. That is to say, the second orthogonal codes may include four orthogonal codes under the assumption that each group includes four driving channels. Accordingly, the driving signal modulator 1120 may generate fifth, sixth, seventh and eighth driving signals by multiplying the second sine wave f2 by the first, second, third and fourth codes, respectively. For example, FIG. 14 shows that a sixth driving signal DS6 is generated by multiplying, by the driving signal modulator 1120, the second sine wave f2 based on the second frequency by the second code C2. According to the example shown in FIG. 14, the driving signal modulator 1120 may output the second sine wave f2 without inverting it when the code value is 1 as indicated by reference numeral 1401. According to the example shown in FIG. 14, the driving signal modulator 1120 may output the second sine wave f2 by inverting it when the code value is −1 as indicated by reference numeral 1402. According to the example in FIG. 14, the driving signal modulator 1120 may include a synthesis module 1310 that synthesizes and outputs second sine waves f2 multiplied by second orthogonal codes. The synthesis module 1310 may synthesize inverted or non-inverted second sine wave f2 according to code values of the second orthogonal codes and output the synthesized second sine waves f2 to each driving channel. In the time domain, the resulting driving signal DS6 may have a sequence similar to the driving signal DS2 described above in the time domain, but based on the second sine waves f2.

Figure 15:
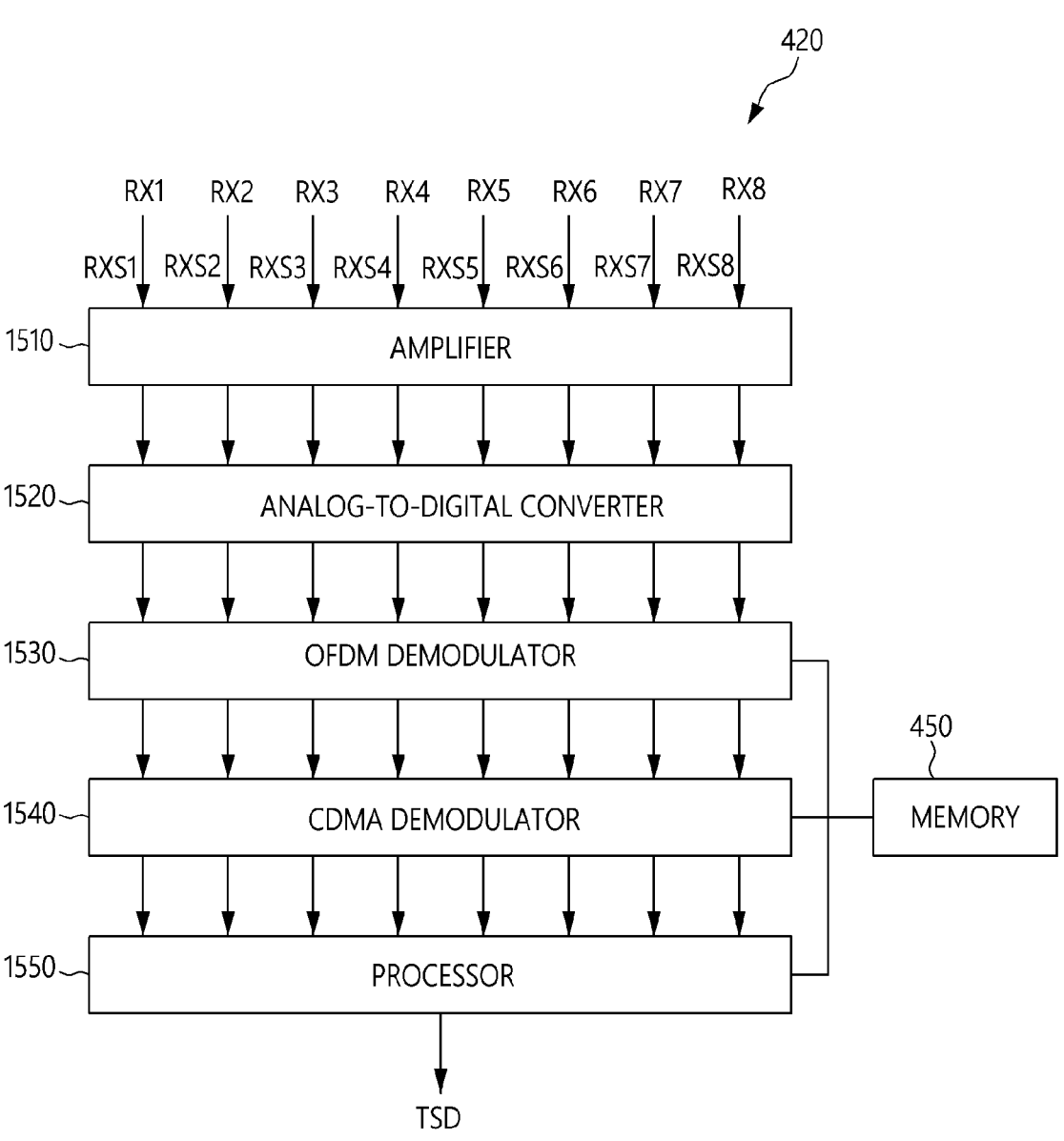
FIG. 15 is a block diagram illustrating a touch driving circuit shown in FIG. 10.

FIG. 15 is a block diagram illustrating the touch sensing circuit 420 shown in FIG. 10.

The touch sensing circuit 420 according to the exemplary embodiment may include a plurality of sensing channels RX1 to EX8 connected to the plurality of sensing electrodes RE. The touch sensing circuit 420 may acquire (or sensor) touch sensing data RXS1 to RXS8 through the plurality of sensing electrodes RE. The touch sensing circuit 420 may demodulate the touch sensing data RXS1 to RXS8 according to the OFDM scheme and demodulate according to the CDMA scheme. For example, the touch sensing circuit 420 may perform a first operation of multiplying the touch sensing data RXS1 to RXS8 by a first frequency and a second frequency, and may perform a second operation of integrating the touch sensing data RXS1 to RXS8 after the first operation as demodulation according to the OFDM scheme. The touch sensing circuit 420 may perform demodulation according to the CDMA scheme after the demodulation according to the OFDM scheme. As the demodulation according to the CDMA scheme, the touch sensing circuit 420 may generate touch identification data corresponding to a change in the capacitance of each of the plurality of touch nodes from the touch sensing data after the second operation by using the first orthogonal codes and the second orthogonal codes.

Hereinafter, functional blocks of the touch sensing circuit 420 will be described in detail with reference to FIG. 15.

Referring to FIG. 15, the touch sensing circuit 420 according to the exemplary embodiment may include an amplifier 1510, an analog-to-digital converter 1520, an OFDM demodulator 1530, a CDMA demodulator 1540, and a digital processor 430.

The amplifier 1510 may receive the first touch sensing data RXS1 to RXS8 through the plurality of sensing channels RX1 to RX8. The amplifier 1510 may amplify and output the input first touch sensing data RXS1 to RXS8. The first touch sensing data RXS1 to RXS8 may include first sensing data RXS1 input through the first sensing channel RX1; second sensing data RXS2 input through the second sensing channel RX2; third sensing data RXS3 input through the third sensing channel RX3; fourth sensing data RXS4 input through the fourth sensing channel RX4; fifth sensing data RXS5 input through the fifth sensing channel RX5; sixth sensing data RXS6 input through the sixth sensing channel RX6; seventh sensing data RXS7 input through the seventh sensing channel RX7, and eighth sensing data RXS8 input through the eighth sensing channel RX8. Although the number of the sensing channels is eight in the example shown in FIG. 15, it is to be understood that this is merely illustrative.

The analog-to-digital converter 1520 may convert the first touch sensing data RXS1 to RXS8 amplified by the amplifier 1510 into digital values. The analog-to-digital converter 1520 may convert the first touch sensing data RXS1 to RXS8 into digital values so that they can be converted into second touch sensing data in the form of discrete signals. For example, the second touch sensing data converted by the analog-to-digital converter 1520 may have a staircase wave form.

The OFDM demodulator 1530 may demodulate the second touch sensing data according to the OFDM scheme. The OFDM demodulator 1530 may acquire the first frequency and the second frequency used to generate the first multi-driving signals DS1 to DS4 and the second multi-driving signals DS5 to DS8 by the touch driving circuit 410 by looking up the memory 450. The OFDM demodulator 1530 may perform a first operation of multiplying the second touch sensing data by a first frequency and a second frequency, and may perform a second operation of integrating the touch sensing data RXS1 to RXS8 after the first operation. As the first operation and the second operation are performed, the touch sensing data may be divided into first data associated with driving electrodes TE of the first group G1 and second data associated with driving electrodes TE of the second group G2.

The CDMA demodulator 1540 may perform demodulation according to the CDMA scheme on first data associated with the driving electrodes TE of the first group G1 and second data associated with the driving electrodes TE of the second group G2. The CDMA demodulator 1540 may acquire the first orthogonal codes and the second orthogonal codes used to generate the first multi-driving signals DS1 to DS4 and the second multi-driving signals DS5 to DS8 by the touch driving circuit 410 by retrieving the same from the memory 450. The CDMA demodulator 1540 may multiply first data associated with the driving electrodes TE of the first group G1 by the first orthogonal codes to demodulate the touch identification data for the driving channels of the driving electrodes TE of the first group G1. For example, the CDMA demodulator 1540 may multiply the first data by the first code to demodulate the first touch identification data associated with the first driving channel TX1 among the driving electrodes TE of the second group G1. The CDMA demodulator 1540 may multiply the first data by the second code to demodulate the second touch identification data associated with the second driving channel TX2 among the driving electrodes TE of the first group G1. The CDMA demodulator 1540 may multiply the first data by the third code to demodulate the third touch identification data associated with the third driving channel TX3 among the driving electrodes TE of the first group G1. The CDMA demodulator 1540 may multiply the first data by the fourth code to demodulate the fourth touch identification data associated with the fourth driving channel TX4 among the driving electrodes TE of the first group G1.

By using a method similar to the above-described method, the CDMA demodulator 1540 may multiply second data associated with the driving electrodes TE of the second group G2 by the second orthogonal codes to demodulate the touch identification data for the driving channels of the driving electrodes TE of the second group G2. In this instance, the second orthogonal codes by which the second data is multiplied may be substantially identical to the first orthogonal codes.

The digital processor 430 may compare the touch identification data demodulated based on the OFDM scheme and the CDMA scheme with a predetermined threshold value, and may determine whether there is a touch input at each touch node based on the comparison results. The digital processor 430 may output touch data TSD if it is determined that there is a touch input.

Figure 16:
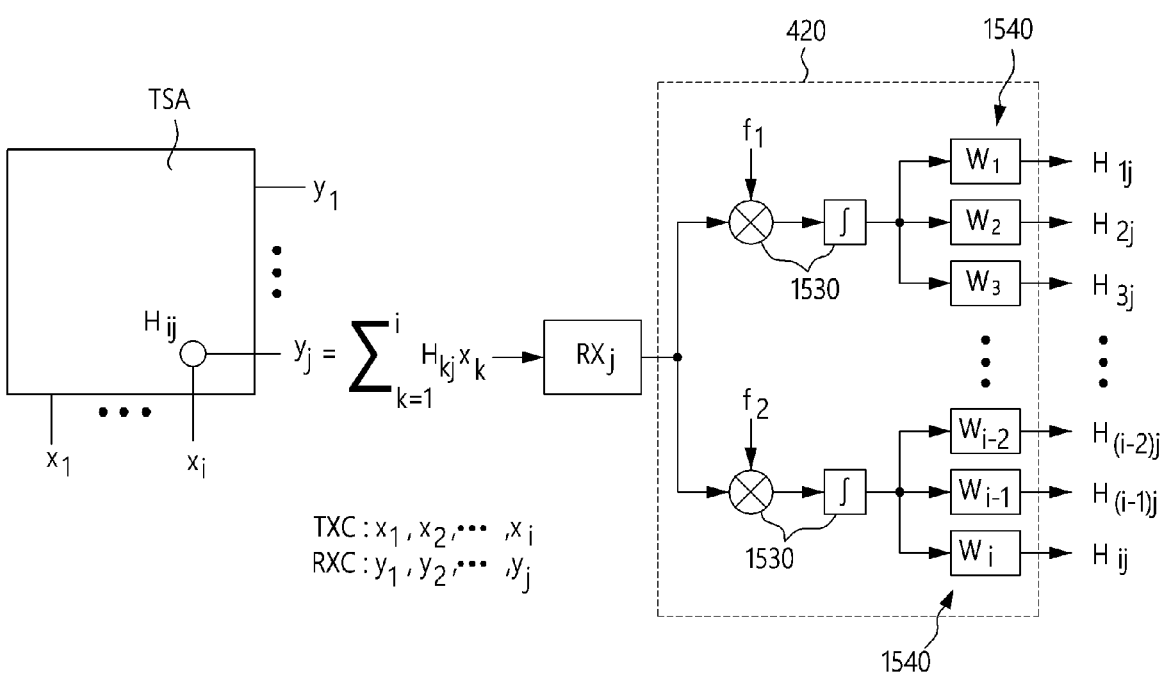
FIG. 16 is a view for conceptually illustrating the operation of a touch sensing circuit according to an exemplary embodiment of the present disclosure.

FIG. 16 is a view for conceptually illustrating the operation of the touch sensing circuit 420 according to an exemplary embodiment of the present disclosure.

Referring to FIG. 16, the touch driver 400 according to the exemplary embodiment may include i driving channels connected to the driving electrodes TE of the touch area TSA, and j sensing channels connected to the sensing electrodes RE of the touch area TSA. For example, the touch driver 400 may include the i driving channels $x_1$ to $x_i$. The touch driver 400 may include the j sensing channels $y_1$ to $y_j$.

In the example shown in FIG. 16, H values may mean changes in capacitance generated at the touch nodes of the touch area TSA. For example, Hij may mean a change in capacitance generated at a touch node that is the intersection of a driving channel $x_i$ and a sensing channel $y_j$. For example, although not shown in the drawings, H11 may mean a change in capacitance generated at a touch node that is the intersection of the driving channel $x_1$ and the sensing channel $y_1$.

In the example shown in FIG. 16, $W_1$, $W_2$, $W_3$, . . . may refer to first orthogonal codes and second orthogonal codes used by the CDMA demodulator 1540 of the touch sensing circuit 420 to demodulate touch identification data for the driving channels.

In the example shown in FIG. 16, the touch sensing circuit 420 may receive touch sensing data associated with touch nodes corresponding to the $j^{th}$ row of the touch area TSA through the $j^{th}$ sensing channel. For example, the touch sensing data sensed by the touch sensing circuit 420 through the $j^{th}$ sensing channel may include all information on changes in capacitance of the touch nodes where the $j^{th}$ sensing electrode RE and the first to $i^{th}$ driving electrodes TE of the touch area TSA intersect each other, as shown in the equation included in FIG. 16.

The OFDM demodulator 1530 of the touch sensing circuit 420 may perform a first operation of multiplying the touch sensing data sensed through the $j^{th}$ sensing channel by the first frequency or the second frequency, and a second operation of integrating the touch sensing data after the first operation. Accordingly, the touch sensing data sensed through the $j^{th}$ sensing channel may be divided into first data associated with the driving electrodes TE of the first group G1 and second data associated with the driving electrodes TE of the second group G2. For example, as the OFDM demodulator 1530 performs the operations of multiplying the touch sensing data sensed through the $j^{th}$ sensing channel by the first frequency and integrating it, the first data containing the information on change in capacitance of the touch nodes where the $j^{th}$ sensing electrode RE and the driving electrodes TE of the first group G1 intersect each other may be demodulated. For example, as the OFDM demodulator 1530 performs the operations of multiplying the touch sensing data sensed through the $j^{th}$ sensing channel by the second frequency and integrating it, the second data containing the information on change in capacitance of the touch nodes where the $j^{th}$ sensing electrode RE and the driving electrodes TE of the second group G2 intersect each other may be demodulated.

The CDMA demodulator 1540 of the touch sensing circuit 420 may multiply the first data by the first orthogonal codes to demodulate the touch identification data for the driving channel associated with each of the driving channels of the first group G1.

The CDMA demodulator 1540 of the touch sensing circuit 420 may multiply the second data by the second orthogonal codes to demodulate the touch identification data for the driving channel associated with each of the driving channels of the first group G1. The second orthogonal codes may be substantially identical to the first orthogonal codes.

Figure 17:
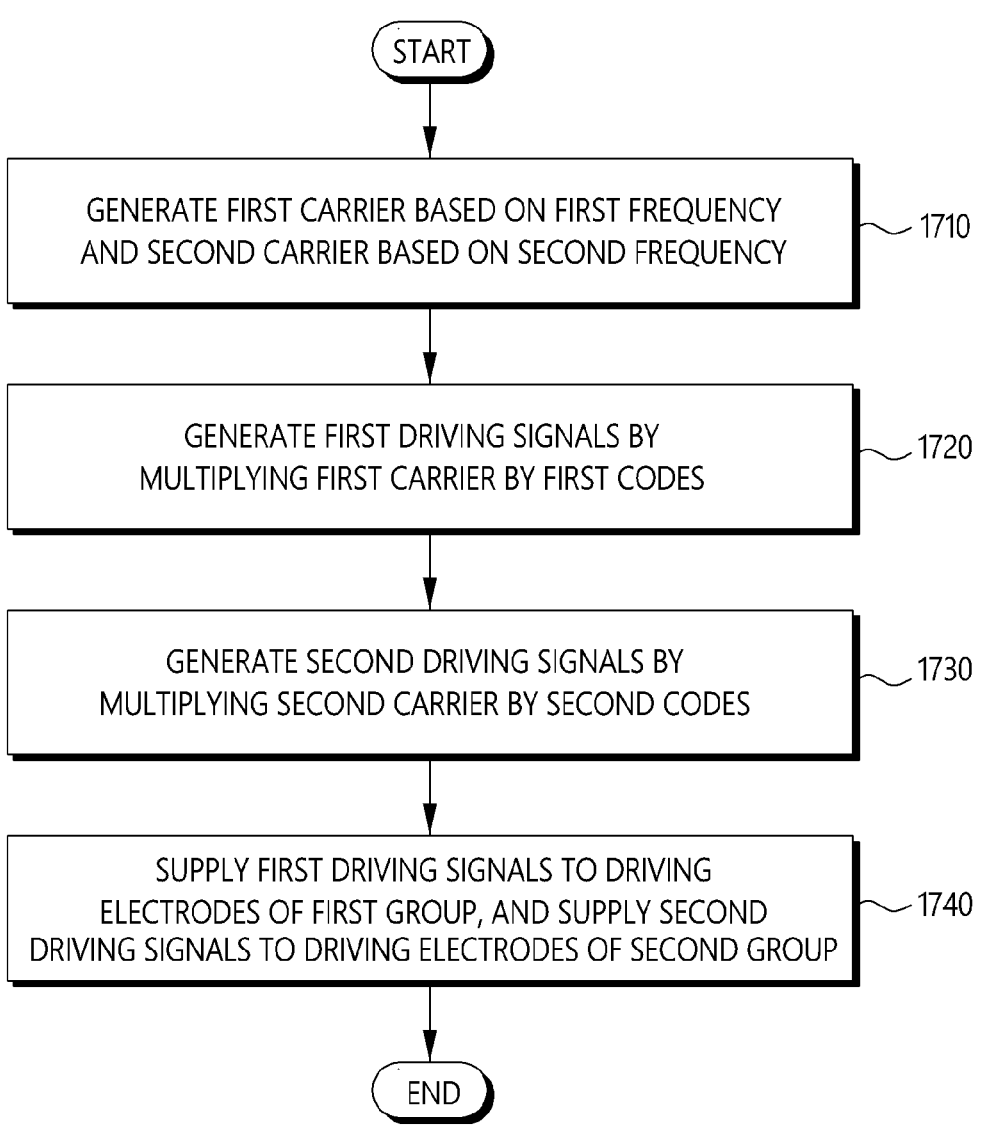
FIG. 17 is a flowchart for illustrating the operations of a touch driving circuit according to an exemplary embodiment.

FIG. 17 is a flowchart for illustrating the operations of the touch driving circuit 410 according to the exemplary embodiment. At least some of the operations illustrated in FIG. 17 may be omitted. Before or after the at least some operations illustrated in FIG. 17, at least some operations described above with reference to the other drawings may be added. Hereinafter, the operations of the touch driving circuit 410 according to an exemplary embodiment will be described with reference to FIG. 17.

In operation 1710, the touch driving circuit 410 according to the exemplary embodiment may drive the touch area TSA by dividing it into a plurality of areas including a first group G1 and a second group G2. For example, the touch driving circuit 410 may drive the driving electrodes TE of the touch area TSA by dividing them into a first group G1 and a second group G2. In this instance, the touch driving circuit 410 may generate a first carrier sf1 based on the first frequency f1 and a second carrier sf2 based on the second frequency f2. The first carrier sf1 and the second carrier sf2 may be orthogonal to each other as described earlier.

In operation 1720, the touch driving circuit 410 according to the exemplary embodiment may generate first driving signals DS1 to DS4 by multiplying the first carrier sf1 by first codes (explained another way, by multiplying sine waves of the carrier sf1 by the first codes as described above, where the sine waves have frequency f1). The first codes are first orthogonal codes orthogonal to each other, and different codes may be assigned to different driving channels connected to the driving electrodes TE of the first group G1. For example, the touch area TSA may include four driving electrodes TE for each group, and in this instance, the first orthogonal codes may include the first to fourth codes as described with reference to Table 1.

In operation 1730, the touch driving circuit 410 according to the exemplary embodiment may generate second driving signals DS5 to DS8 by multiplying the second carrier sf2 by second codes. The second codes are second orthogonal codes orthogonal to each other, and different codes may be assigned to different driving channels connected to the driving electrodes TE of the second group G2. For example, the touch area TSA may include four driving electrodes TE for each group, and in this instance, the first orthogonal codes may include the first to fourth codes as described with reference to Table 2. The second orthogonal codes may be substantially identical to the first orthogonal codes.

In operation 1740, the touch driving circuit 410 according to the exemplary embodiment may supply the first driving signals DS1 to DS4 to the driving electrodes TE of the first group G1, and may supply the second driving signals DS5 to DS8 to the driving electrodes TE of the second group G2. The first driving signals DS1 to DS4 and the second driving signals DS5 to DS8 are parallel signals and may be simultaneously supplied to the driving electrodes TE of the touch area TSA.

FIG. 18 is a flowchart for illustrating the operations of the touch sensing circuit 420 according to the exemplary embodiment. At least some of the operations illustrated in FIG. 18 may be omitted. Before or after the at least some operations illustrated in FIG. 18, at least some operations described above with reference to the other drawings may be added. Hereinafter, the operations of the touch sensing circuit 420 according to an exemplary embodiment will be described with reference to FIG. 18.

In operation 1810, the touch sensing circuit 420 according to the exemplary embodiment may acquire touch sensing data through a plurality of sensing electrodes RE. The touch sensing circuit 420 may acquire the touch sensing data through a plurality of sensing channels RXC connected to the plurality of sensing electrodes RE. The touch sensing data input from a sensing channel may contain information on a change in capacitance of touch nodes formed by the sensing electrode RE connected to the sensing channel and the plurality of driving electrodes TE crossing the sensing electrode RE. For example, the touch sensing circuit 420 may receive touch sensing data associated with touch nodes corresponding to the $j^{th}$ row of the touch area TSA at once through the $j^{th}$ sensing channel.

In operation 1820, the touch sensing circuit 420 according to the exemplary embodiment may perform a first operation of multiplying touch sensing data by the first frequency and the second frequency. For example, the OFDM demodulator 1530 of the touch sensing circuit 420 may acquire the first frequency and the second frequency used to generate the first driving signals DS1 to DS4 and the second driving signals DS5 to DS8 by the touch driving circuit 410 by looking up the memory 450.

In operation 1830, the touch sensing circuit 420 according to the exemplary embodiment may perform a second operation of integrating the touch sensing data on which the first operation has been performed. As the first operation and the second operation are performed, the touch sensing data may be divided into first data associated with driving electrodes TE of the first group G1 and second data associated with driving electrodes TE of the second group G2.

In operation 1840, the touch sensing circuit 420 according to the exemplary embodiment may generate touch identification data associated with each of the channels of the first group G1 from the touch sensing data on which the second operation has been performed using the first codes. For example, the CDMA demodulator 1540 of the touch sensing circuit 420 may multiply the first data by the first code to demodulate first touch identification data associated with the first driving channel among the driving electrodes TE of the first group G1. The CDMA demodulator 1540 may multiply the first data by the second code to demodulate the second touch identification data associated with the second driving channel among the driving electrodes TE of the first group G1. The CDMA demodulator 1540 may multiply the first data by the third code to demodulate the third touch identification data associated with the third driving channel among the driving electrodes TE of the first group G1. The CDMA demodulator 1540 may multiply the first data by the fourth code to demodulate the fourth touch identification data associated with the fourth driving channel among the driving electrodes TE of the first group G1.

In operation 1850, the touch sensing circuit 420 according to the exemplary embodiment may generate touch identification data associated with each of the channels of the second group G2 from the touch sensing data on which the second operation has been performed using the second codes. The second codes may be substantially identical to the first codes. For example, the CDMA demodulator 1540 of the touch sensing circuit 420 may multiply the second data by the first code to demodulate fifth touch identification data associated with the fifth driving channel TX5 among the driving electrodes TE of the second group G2. The CDMA demodulator 1540 may multiply the second data by the second code to demodulate the sixth touch identification data associated with the sixth driving channel TX6 among the driving electrodes TE of the second group G2. The CDMA demodulator 1540 may multiply the second data by the third code to demodulate the seventh touch identification data associated with the seventh driving channel TX7 among the driving electrodes TE of the second group G2. The CDMA demodulator 1540 may multiply the second data by the fourth code to demodulate the eighth touch identification data associated with the eighth driving channel TX8 among the driving electrodes TE of the second group G2.

In concluding the detailed description, those skilled in the art will appreciate that many variations and modifications can be made to the disclosed embodiments without substantially departing from the principles of the inventive concept. Therefore, the disclosed embodiments are used in a generic and descriptive sense only and not for purposes of limitation.

What is claimed is:

1. A touch detection device comprising:

touch electrodes comprising a plurality of driving electrodes and a plurality of sensing electrodes intersecting the plurality of driving electrodes to form a plurality of touch nodes;

a touch driving circuit electrically connected to the plurality of driving electrodes and configured to supply driving signals generated based on an orthogonal frequency division multiplexing (OFDM) scheme and a code division multiple access (CDMA) scheme to the plurality of driving electrodes; and a touch sensing circuit electrically connected to the plurality of sensing electrodes and configured to sense a change in capacitance of each of the plurality of touch nodes through the plurality of sensing electrodes while the driving signals are supplied to the plurality of driving electrodes, wherein the touch driving circuit drives the driving electrodes simultaneously in groups including at least a first group and a second group, supplies first driving signals based on a designated first frequency and first orthogonal codes set to correspond to the driving electrodes of the first group, respectively, to the driving electrodes of the first group, and supplies second driving signals based on a second frequency orthogonal to the first frequency and second orthogonal codes set to correspond to the driving electrodes of the second group, respectively, to the driving electrodes of the second group, wherein the first orthogonal codes comprise first to nth codes associated with n driving electrodes, respectively, and wherein the first to nth codes comprise data based on Walsh codes orthogonal to one another, wherein the touch sensing circuit acquires touch sensing data items through the sensing electrodes, performs a first operation of multiplying the touch sensing data items by the first frequency and the second frequency, performs a second operation of integrating the touch sensing data items after the first operation has been performed; and generates touch identification data corresponding to a change in capacitance of each of the touch nodes from the touch sensing data items after the second operation has been performed using the first orthogonal codes and the second orthogonal codes, and wherein the touch driving circuit comprises:

a frequency generator configured to generate a first sine wave based on the first frequency and a second sine wave based on the second frequency; and a driving signal modulator configured to generate the first driving signals by multiplying the first sine wave by the first orthogonal codes and generate the second driving signals by multiplying the second sine wave by the second orthogonal codes, wherein the touch sensing circuit comprises:

an amplifier configured to amplify first touch sensing data items sensed through the plurality of sensing electrodes;

an analog-to-digital converter configured to generate second touch sensing data items by converting the amplified first touch sensing data items into digital data;

an OFDM demodulator configured to perform the first operation and the second operation on the second touch sensing data items; and a CDMA demodulator configured to generate touch identification data from the second touch sensing data items after the second operation has been performed using the first orthogonal codes and the second orthogonal codes, wherein the first orthogonal codes comprise first to fourth codes associated with four driving electrodes, respectively, and wherein the first to fourth codes have respective sets of code values of (1, 1, 1, 1); (1, −1, 1, −1); (1, 1, −1, −1); and (1, −1, −1, 1), and wherein the second orthogonal codes are the same as the first orthogonal codes and are associated with four other driving electrodes, respectively.

2. The device of claim 1, wherein the driving electrodes of the first group comprises n driving electrodes, and wherein the driving electrodes of the second group comprises m driving electrodes, wherein n is equal to m.

3. A display device comprising:

a display panel; and a touch detection device, wherein the touch detection device comprises:

touch electrodes comprising a plurality of driving electrodes and a plurality of sensing electrodes intersecting the plurality of driving electrodes to form a plurality of touch nodes;

a touch driving circuit electrically connected to the plurality of driving electrodes and configured to supply driving signals generated based on an orthogonal frequency division multiplexing (OFDM) scheme and a code division multiple access (CDMA) scheme to the plurality of driving electrodes; and a touch sensing circuit electrically connected to the plurality of sensing electrodes and configured to sense a change in capacitance of each of the plurality of touch nodes through the plurality of sensing electrodes while the driving signals are supplied to the plurality of driving electrodes, wherein the touch driving circuit drives the driving electrodes simultaneously in groups comprising a first group and a second group, supplies first driving signals based on a designated first frequency and first orthogonal codes set to correspond to the driving electrodes of the first group, respectively, to the driving electrodes of the first group, and supplies a second multi-drive signal based on a second frequency orthogonal to the first frequency and second orthogonal codes set to correspond to each of the second group of drive electrodes to the second group of drive electrodes, wherein the first orthogonal codes comprise first to nth codes associated with n driving electrodes, respectively, and wherein the first to nth codes comprise data based on Walsh codes orthogonal to one another, wherein the touch sensing circuit acquires touch sensing data items through the sensing electrodes, performs a first operation of multiplying the touch sensing data items by the first frequency and the second frequency, performs a second operation of integrating the touch sensing data items after the first operation has been performed; and generates touch identification data corresponding to a change in capacitance of each of the touch nodes from the touch sensing data items after the second operation has been performed using the first orthogonal codes and the second orthogonal codes, wherein the touch driving circuit comprises:

a frequency generator configured to generate a first sine wave based on the first frequency and a second sine wave based on the second frequency; and a driving signal modulator configured to generate the first driving signals by multiplying the first sine wave by the first orthogonal codes and generate the second driving signals by multiplying the second sine wave by the second orthogonal codes, wherein the touch sensing circuit comprises:

an amplifier configured to amplify first touch sensing data items sensed through the plurality of sensing electrodes;

an analog-to-digital converter configured to generate second touch sensing data items by converting the amplified first touch sensing data items into digital data;

an OFDM demodulator configured to perform the first operation and the second operation on the second touch sensing data items; and a CDMA demodulator configured to generate touch identification data from the second touch sensing data items after the second operation has been performed using the first orthogonal codes and the second orthogonal codes, wherein the first orthogonal codes comprise first to fourth codes associated with four driving electrodes, respectively, and wherein the first to fourth codes have respective sets of code values of $(1, 1, 1, 1)$; $(1, -1, 1, -1)$; $(1, 1, -1, -1)$; and $(1, -1, -1, 1)$, and wherein the second orthogonal codes are the same as the first orthogonal codes and are associated with four other driving electrodes, respectively.

4. The display device of claim 3, wherein the driving electrodes of the first group comprises n driving electrodes, and wherein the driving electrodes of the second group comprises m driving electrodes, wherein n is equal to m.

5. A method of driving a display device comprising a display panel and a touch detection device, the method comprising:

supplying, by a touch driving circuit, driving signals generated based on an orthogonal frequency division multiplexing (OFDM) scheme and a code division multiple access (CDMA) scheme to a plurality of driving electrodes; and sensing a change in capacitance of each of a plurality of touch nodes through a plurality of sensing electrodes while the driving signals are supplied to the plurality of driving electrodes, wherein the supplying of the driving signals comprises:

driving the driving electrodes simultaneously in groups comprising a first group and a second group, supplying first driving signals based on a designated first frequency and first orthogonal codes set to correspond to the driving electrodes of the first group, respectively, to the driving electrodes of the first group, and supplying second driving signals based on a second frequency orthogonal to the first frequency and second orthogonal codes set to correspond to the driving electrodes of the second group, respectively, to the driving electrodes of the second group;

acquiring touch sensing data items through the sensing electrodes;

performing a first operation of multiplying the touch sensing data items by the first frequency and the second frequency;

performing a second operation of integrating the touch sensing data items after the first operation has been performed; and generating touch identification data corresponding to a change in capacitance of each of the touch nodes from the touch sensing data items after the second operation has been performed using the first orthogonal codes and the second orthogonal codes, wherein the first orthogonal codes comprise first to nth codes associated with n driving electrodes, respectively, and wherein the first to nth codes comprise data based on Walsh codes orthogonal to one another, and wherein the method further comprises:

generating, by a frequency generator, a first sine wave based on the first frequency and a second sine wave based on the second frequency;

generating, by a driving signal modulator, the first driving signals by multiplying the first sine wave by the first orthogonal codes and generating the second driving signals by multiplying the second sine wave by the second orthogonal codes amplifying first touch sensing data items sensed through the plurality of sensing electrodes;

generating second touch sensing data items by analog-to-digital converting the amplified first touch sensing data items into digital data;

performing, by an OFDM demodulator, the first operation and the second operation on the second touch sensing data items; and generating, by a CDMA demodulator, touch identification data from the second touch sensing data items after the second operation has been performed using the first orthogonal codes and the second orthogonal codes, wherein the first orthogonal codes comprise first to fourth codes associated with four driving electrodes, respectively, and wherein the first to fourth codes have respective sets of code values of $(1, 1, 1, 1)$; $(1, -1, 1, -1)$; $(1, 1, -1, -1)$; and $(1, -1, -1, 1)$, and wherein the second orthogonal codes are the same as the first orthogonal codes and are associated with four other driving electrodes, respectively.

6. The method of claim 5, wherein the driving electrodes of the first group comprises n driving electrodes, and wherein the driving electrodes of the second group comprises m driving electrodes, wherein n is equal to m.

7. An electronic device comprising:

touch electrodes comprising a plurality of driving electrodes and a plurality of sensing electrodes intersecting the plurality of driving electrodes to form a plurality of touch nodes;

a touch driving circuit electrically connected to the plurality of driving electrodes and configured to supply driving signals generated based on orthogonal carriers and a code division multiple access (CDMA) scheme to the plurality of driving electrodes; and a touch sensing circuit electrically connected to the plurality of sensing electrodes and configured to sense a change in capacitance of each of the plurality of touch nodes through the plurality of sensing electrodes while the driving signals are supplied to the plurality of driving electrodes, wherein the touch driving circuit drives the driving electrodes simultaneously in groups including at least a first group and a second group, supplies first driving signals based on a designated first frequency and first orthogonal codes set to correspond to the driving electrodes of the first group, respectively, to the driving electrodes of the first group, and supplies second driving signals based on a second frequency orthogonal to the first frequency and second orthogonal codes set to correspond to the driving electrodes of the second group, respectively, to the driving electrodes of the second group, wherein the first orthogonal codes comprise first to nth codes associated with n driving electrodes, respectively, and wherein each of the first to nth codes comprises 1 which refers to non-inversion of a phase, or −1 which refers to inversion of a phase, wherein the touch sensing circuit acquires touch sensing data items through the sensing electrodes, performs a first operation of multiplying the touch sensing data items by the first frequency and the second frequency, performs a second operation of integrating the touch sensing data items after the first operation has been performed; and generates touch identification data corresponding to a change in capacitance of each of the touch nodes from the touch sensing data items after the second operation has been performed using the first orthogonal codes and the second orthogonal codes, and wherein the touch driving circuit comprises:

a frequency generator configured to generate a first sine wave based on the first frequency and a second sine wave based on the second frequency; and a driving signal modulator configured to generate the first driving signals by multiplying the first sine wave by the first orthogonal codes and generate the second driving signals by multiplying the second sine wave by the second orthogonal codes, wherein the touch sensing circuit comprises:

an amplifier configured to amplify first touch sensing data items sensed through the plurality of sensing electrodes;

an analog-to-digital converter configured to generate second touch sensing data items by converting the amplified first touch sensing data items into digital data;

an OFDM demodulator configured to perform the first operation and the second operation on the second touch sensing data items; and a CDMA demodulator configured to generate touch identification data from the second touch sensing data items after the second operation has been performed using the first orthogonal codes and the second orthogonal codes, wherein the first orthogonal codes comprise first to fourth codes associated with four driving electrodes, respectively, and wherein the first to fourth codes have respective sets of code values of $(1, 1, 1, 1)$; $(1, -1, 1, -1)$; $(1, 1, -1, -1)$; and $(1, -1, -1, 1)$, and wherein the second orthogonal codes are the same as the first orthogonal codes and are associated with four other driving electrodes, respectively.

* * * * *